US012584639B2

(12) United States Patent
Wang et al.

(10) Patent No.: US 12,584,639 B2
(45) Date of Patent: Mar. 24, 2026

(54) ELECTRIC CONTROL BOX, AIR CONDITIONING OUTDOOR UNIT, AIR CONDITIONER AND METHOD FOR ASSEMBLING ELECTRIC CONTROL BOX

(71) Applicants: GD Midea Heating & Ventilating Equipment Co., Ltd., Foshan (CN); Hefei Midea Heating & Ventilating Equipment Co., Ltd., Hefei (CN)

(72) Inventors: Guochun Wang, Foshan (CN); An Xu, Foshan (CN); Kaiquan Song, Foshan (CN); Huadong Luo, Foshan (CN); Langshui Huang, Foshan (CN); Hongwei Li, Foshan (CN); Yuzhao Luo, Foshan (CN)

(73) Assignees: GD MIDEA HEATING & VENTILATING EQUIPMENT CO., LTD., Foshan (CN); HEFEI MIDEA HEATING & VENTILATING EQUIPMENT CO., LTD., Hefei (CN)

( * ) Notice: Subject to any disclaimer, the term of this patent is extended or adjusted under 35 U.S.C. 154(b) by 335 days.

(21) Appl. No.: 18/522,076

(22) Filed: Nov. 28, 2023

(65) Prior Publication Data

US 2024/0093888 A1     Mar. 21, 2024

Related U.S. Application Data

(63) Continuation of application No. PCT/CN2022/096094, filed on May 30, 2022.

(30) Foreign Application Priority Data

Aug. 7, 2021   (CN) ......................... 202110904560.X
Aug. 7, 2021   (CN) ......................... 202121838776.2

(Continued)

(51) Int. Cl.
*F24F 1/22*        (2011.01)
*H05K 7/20*        (2006.01)

(52) U.S. Cl.
CPC ........... *F24F 1/22* (2013.01); *H05K 7/20327* (2013.01)

(58) Field of Classification Search
CPC ...... F24F 1/24; F24F 1/22; F24F 13/30; F24F 13/20; H05K 1/0203; H05K 7/20254;
(Continued)

(56) References Cited

U.S. PATENT DOCUMENTS 7,848,105 B2 * 12/2010 Holmes ..................... G06F 1/20
                                                              174/16.3
8,681,501 B2 *  3/2014 Govindasamy ......... G06F 1/203
                                                              174/16.3
(Continued)

FOREIGN PATENT DOCUMENTS

CN        102635925 A      8/2012
CN        203010793 U      6/2013
(Continued)

OTHER PUBLICATIONS

Midea Group Co., Ltd., WO, PCT/CN2022/096094, Aug. 5, 2022, 6 pgs.
(Continued)

*Primary Examiner* — Mandeep S Buttar
(74) *Attorney, Agent, or Firm* — Morgan, Lewis & Bockius LLP

(57) ABSTRACT

An electric control box includes a shell, a mounting plate, and a heat exchanger; the mounting plate and the heat exchanger are connected by screw-thread fitting of a first fastener and corresponding connecting holes, the mounting plate and the heat exchanger are located inside the shell, and the heat exchanger is located between the mounting plate
(Continued)

100 and an inner bottom face of the shell; the mounting plate and the shell are connected by screw-thread fitting of a second fastener and corresponding connecting holes.

20 Claims, 16 Drawing Sheets

(30)  Foreign Application Priority Data

| Aug. 7, 2021 | (CN) | ......................... 202121839092.4 |
| Aug. 7, 2021 | (CN) | ......................... 202121839182.3 |
| Aug. 7, 2021 | (CN) | ......................... 202121839393.7 |

(58) Field of Classification Search

CPC ...... H05K 2201/066; H05K 5/03; H05K 5/06; H05K 7/1427; H05K 7/209; H05K 9/0022; G06F 1/20; G06F 1/181

USPC ......................................................... 361/699

See application file for complete search history.

(56)  References Cited

U.S. PATENT DOCUMENTS

| 9,295,185 | B2 * | 3/2016 | Icoz | ................... H05K 7/20927 |
| 9,907,208 | B2 * | 2/2018 | Bose | ................... H05K 7/2039 |
| 11,006,548 | B2 * | 5/2021 | Wong | ................. H05K 7/20681 |
| 11,122,707 | B2 * | 9/2021 | Diep | ................... H05K 7/1427 |
| 2017/0115012 | A1 | 4/2017 | Kim et al. | |
| 2019/0301753 | A1 | 10/2019 | Taniguchi et al. | |

FOREIGN PATENT DOCUMENTS

| CN | 203136413 | U | 8/2013 |
| CN | 203301908 | U | 11/2013 |
| CN | 104896615 | A | 9/2015 |
| CN | 205383926 | U | 7/2016 |
| CN | 104896615 | B | 11/2017 |
| CN | 207146814 | U | 3/2018 |
| CN | 207622161 | U | 7/2018 |
| CN | 207622217 | U | 7/2018 |
| CN | 108679809 | A | 10/2018 |
| CN | 209622967 | U | 11/2019 |
| CN | 110594878 | A | 12/2019 |
| CN | 108679809 | B | 1/2020 |
| CN | 210688511 | U | 6/2020 |
| CN | 111595009 | A | 8/2020 |
| CN | 211854379 | U | 11/2020 |
| CN | 212376936 | U | 1/2021 |
| CN | 212961914 | U | 4/2021 |
| CN | 213089964 | U | 4/2021 |
| CN | 213480427 | U | 6/2021 |
| CN | 215412219 | U | 1/2022 |
| CN | 215412222 | U | 1/2022 |
| CN | 215413279 | U | 1/2022 |
| CN | 215872450 | U | 2/2022 |
| JP | 2006156647 | A | 6/2006 |
| JP | 2011106730 | A | 6/2011 |

OTHER PUBLICATIONS

Midea Group Co., Ltd., IPRP, PCT/CN2022/096094, Feb. 13, 2024, 7 pgs.

Midea Group Co., Ltd., Extended European Search Report, EP Patent Application No. 22855049.7, Sep. 10, 2024, 8 pgs.

Midea Group Co., Ltd., ISR, PCT/CN2022/096094, Aug. 5, 2022, 3 pgs.

GD Midea Heating & Ventilating Equipment Co., Ltd., et al., Chinese Office Action, CN Patent Application No. 202110904560.X, Apr. 13, 2025, 17 pgs.

* cited by examiner

100

100

A

D

E

F

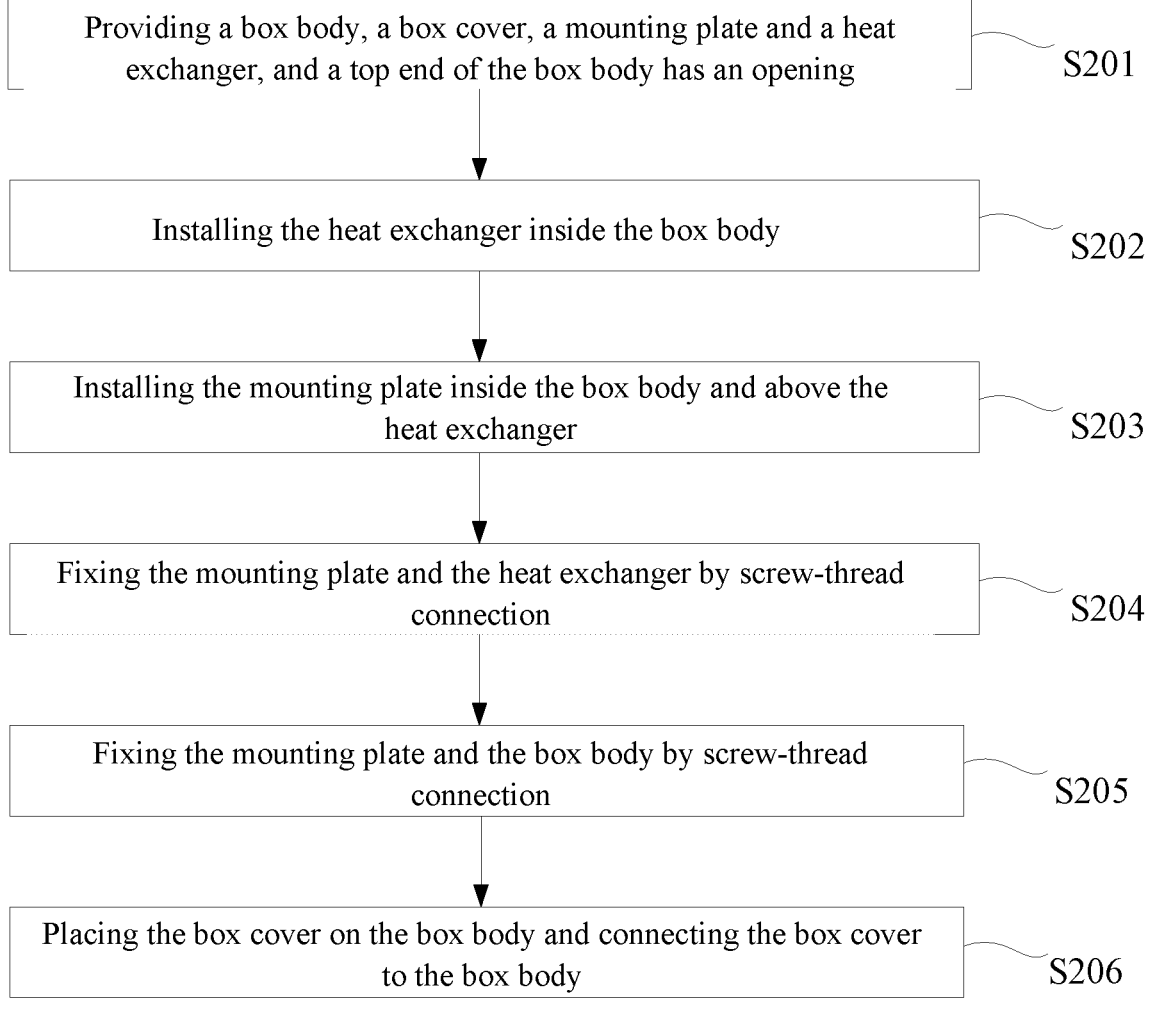

Providing a box body, a box cover, a mounting plate and a heat exchanger, and a top end of the box body has an opening — S201

Installing the heat exchanger inside the box body — S202

Installing the mounting plate inside the box body and above the heat exchanger — S203

Fixing the mounting plate and the heat exchanger by screw-thread connection — S204

Fixing the mounting plate and the box body by screw-thread connection — S205

Placing the box cover on the box body and connecting the box cover to the box body — S206

FIG. 25

ELECTRIC CONTROL BOX, AIR CONDITIONING OUTDOOR UNIT, AIR CONDITIONER AND METHOD FOR ASSEMBLING ELECTRIC CONTROL BOX

RELATED APPLICATIONS

This application is a continuation of International (PCT) Patent Application No. PCT/CN2022/096094, filed May 30, 2022, and claims priority to Chinese Patent Application No. 202110904560.X, filed on Aug. 7, 2021, entitled "Electric Control Box, Method for Assembling Electric Control Box, and Air Conditioner"; Chinese Patent Application No. 202121839182.3, filed on Aug. 7, 2021, entitled "Electric Control Box and Air Conditioner"; Chinese Patent Application No. 202121839393.7, filed on Aug. 7, 2021, entitled "Electric Control Box, Air Conditioning Outdoor Unit and Air Conditioner"; Chinese Patent Application No. 202121839092.4, filed on Aug. 7, 2021, entitled "Electric Control Box, Air Conditioning Outdoor Unit and Air Conditioner" and Chinese Patent Application No. 202121838776.2, filed on Aug. 7, 2021, entitled "Heat Exchanger Component, Electric Control Box, Conditioning Outdoor Unit and Air Conditioner," which are incorporated herein by reference in their entireties.

TECHNICAL FIELD

The present application relates to the technical field of air conditioners, and in particular, to an electric control box, an air conditioning outdoor unit, an air conditioner and a method for assembling the electric control box.

BACKGROUND

Air conditioner refers to a device for adjusting and controlling parameters such as temperature, humidity, and flow rate of ambient air in a building or a structure by using artificial means. An air conditioner generally includes an electric control box, and the electric control box generally includes a shell and various components provided inside the shell. However, there are a large number of components inside the electric control box, and the assembly manners between the components are complicated, resulting in low automatic assembly degree between components and poor production efficiency.

SUMMARY

The main objective of the present application is to provide an electric control box, a method for assembling the electric control box, and an air conditioner, aiming at solving the technical problem of low automatic assembly degree between components of the electric control box and poor production efficiency.

In order to achieve the above objective, the present application discloses an electric control box, which includes a shell, a mounting plate, and a heat exchanger; the mounting plate and the heat exchanger are connected by screw-thread fitting of a first fastener and corresponding connecting holes, the mounting plate and the heat exchanger are located inside the shell, and the heat exchanger is located between the mounting plate and an inner bottom face of the shell; the mounting plate and the shell are connected by screw-thread fitting of a second fastener and corresponding connecting holes.

Furthermore, the heat exchanger includes a heat exchange pipe, each of both ends of the heat exchange pipe is provided with a connecting member, and the connecting member is provided with a first connecting hole; the mounting plate includes a main body, each of both ends of the main body is provided with at least one second connecting hole opposite to the first connecting hole, each of both ends of the mounting plate and each of both ends of the heat exchanger are in threaded connection by screw-thread fitting of the first fastener and the first connecting hole as well as the second connecting hole.

Furthermore, the heat exchanger further includes a heat dissipation plate, the heat dissipation plate is provided on the heat exchange pipe, and the heat dissipation plate is provided with a first assembly hole; a second assembly hole is provided in the mounting plate at a position corresponding to the first assembly hole, and a middle part of the mounting plate and a middle part of the heat exchanger are in threaded connection by screw-thread fitting of a threaded assembly component and the first assembly hole as well as the second assembly hole.

Furthermore, the mounting plate and the heat exchanger are provided in a stacked manner, the mounting plate is provided with an avoidance hole and an avoidance protrusion, and the avoidance protrusion protrudes from a plate face of the mounting plate towards a side facing away from the heat exchanger.

Furthermore, the heat dissipation plate includes a protruding platform, and the avoidance hole is correspondingly arranged with the protruding platform, and the protruding platform passes through the avoidance hole, the avoidance hole is provided in a middle area of the mounting plate.

Furthermore, at least two protruding platforms are included, and the at least two protruding platforms are provided in parallel on the heat dissipation plate; at least two avoidance holes are included, and the at least two avoidance holes are provided in parallel in the mounting plate, and the at least two protruding platforms and the at least two avoidance holes are arranged in one-to-one correspondence.

Furthermore, at least a part of an edge of the avoidance hole is provided with a first edgefold, and the first edgefold extends along an axial direction of the avoidance hole to be supported at a side of the protruding platform.

Furthermore, the circumferential edge of the avoidance hole is provided with the first edgefold.

Furthermore, the mounting plate is provided with a reinforcing rib, the reinforcing rib includes at least one of a convex rib and a concave rib, and the reinforcing rib extends on the mounting plate in a straight-line manner, a curved-line-manner or a meander-line manner.

Further, the reinforcing rib extends along a circumferential direction of an electronic device disposed on the mounting plate; and/or the reinforcing rib extends along a circumferential direction of the avoidance hole.

Furthermore, the shell includes a box body and a box cover, the box body is provided with a holding chamber having a first opening, the box cover is connected to the box body, and the box cover covers the first opening; the mounting plate is provided opposite to the box cover, the heat exchanger is provided opposite to a bottom of the box body, and the mounting plate is in threaded connection with the bottom of the box body.

Furthermore, the bottom of the box body is provided with a mounting plate fixing member, and a third connecting hole is provided in the mounting plate, the third connecting hole is correspondingly arranged with the mounting plate fixing member, and the mounting plate and the box body are connected to the third connecting hole and the mounting plate fixing member through the second fastener.

Furthermore, the mounting plate fixing member includes a supporting base and a connecting column, the supporting base is connected to a bottom plate of the box body, the connecting column is connected to a top end of the supporting base, the mounting plate is connected to the connecting column, and a projection of the supporting base onto the bottom plate covers a projection of the connecting column onto the bottom plate.

Furthermore, the supporting base includes a main body part and two mounting parts connected to both opposite sides of the main body part, the two mounting parts are connected to the bottom plate, a gap is provided between the main body part and the bottom plate, and the connecting column is fixed to the main body part.

Furthermore, in the two mounting parts and the connecting column included in one supporting base, the two mounting parts are symmetrically provided relative to the connecting column, and bottoms of the two mounting parts are attached to the bottom plate.

Furthermore, the heat exchanger further includes an input pipe and an output pipe; two avoidance protrusions are provided, the avoidance protrusions are provided on both opposite sides of the mounting plate, respectively, and the two avoidance protrusions are provided corresponding to the input pipe and the output pipe respectively.

Furthermore, a ventilation grid is provided between the two avoidance protrusions of the mounting plate, a bending part surrounding the ventilation grid is provided around the ventilation grid, the bending part is bent towards a side away from the heat exchanger, and a plane where the ventilation grid is located protrudes towards a side away from the heat exchanger.

Furthermore, a second edgefold is provided on an edge of a side of the mounting plate at least close to the ventilation grid, the second edgefold extends towards the heat exchanger, and the second edgefold is provided with an avoidance gap for the input pipe and the output pipe of the heat exchanger to extend out.

Furthermore, the box body is provided with an avoidance groove located at a position opposite to each of the input pipe and output pipe and dented towards an outer side of the holding chamber, and the avoidance groove is provided at an edge of each of two opposite sides of the bottom plate.

Furthermore, the box body includes a box main body and a packaging plate; the box main body includes a bottom plate and a side plate, and the side plate is provided around a part of an outer peripheral edge of the bottom plate, so that a side face of the box main body has a first side opening; the packaging plate is provided at the first side opening, and the packaging plate and the side plate are located on a same side of the bottom plate.

Furthermore, a first bending part is provided on an edge, facing the packaging plate, of the side plate, a fourth connecting hole is provided in the first bending part; the packaging plate is provided with a fifth connecting hole, and the side plate is connected to the packaging plate by screw-thread fitting of a third fastener and the fourth connecting hole as well as the fifth connecting hole.

Furthermore, a second bending part is provided on an edge, corresponding to the bottom plate, of the bottom plate, and a sixth connecting hole is provided in the second bending part; the packaging plate is provided with a seventh connecting hole, and the side plate is connected to the packaging plate by screw-thread fitting of a fourth fastener and the sixth connecting hole as well as the seventh connecting hole.

Furthermore, a first end of the input pipe is communicated with an inlet of the heat exchange pipe, and a first end of the output pipe is communicated with an outlet of the heat exchange pipe; the packaging plate is provided with a first avoidance part and a second avoidance part, the input pipe passes through the first avoidance part and the output pipe passes through the second avoidance part; and the first end of the input pipe is located within the shell, and a second end of the input pipe is located outside the shell; the first end of the output pipe is located within the shell, and a second end of the output pipe is located outside the shell.

Furthermore, an inner surface of the bottom plate is provided with multiple convex blocks protruding towards an inner side of the holding chamber, and at least some mounting plate fixing members are disposed on the convex blocks.

Furthermore, a connecting assembly located on the box body is further included, the connecting assembly includes a hanging plate and at least two connecting members; the connecting members and the hanging plate jointly support the electric control box, the hanging plate is configured to limit the electric control box from moving in a vertical direction, the at least two connecting members are configured to limit the electric control box from moving in a first direction and a second direction respectively, the first direction is opposite to the second direction, and both the first direction and the second direction are perpendicular to the vertical direction.

Furthermore, the at least two connecting members include a first connecting member and a second connecting member, the first connecting member and the second connecting member are respectively provided at two opposite sides of the box body, the first connecting member is configured to limit the electric control box from moving in the first direction, and the second connecting member is configured to limit the electric control box from moving in the second direction.

Furthermore, the hanging plate is located at a top end of the box body, a lower end of the hanging plate is connected to an edge of a top wall of the box body, an upper end of the hanging plate extends in a direction away from the box body, a hanging hole for hanging the electric control box is provided in the hanging plate, and the hanging plate limits the electric control box from moving in the vertical direction by using the hanging hole.

Furthermore, the hanging plate is integrated with a side wall of the box body.

Furthermore, the hanging hole includes an extension part and a suspension part, the suspension part is located above the extension part; a hole diameter of the extension part is greater than a hole diameter of the suspension part, and a cross-sectional shape of the hanging hole formed by the extension part and the suspension part is one of a trapezoid shape, a cucurbit shape, and an inverted T-shape.

Furthermore, each of the connecting members is located at an end of the side wall of the box body away from the hanging plate.

Furthermore, each of the connecting members includes a connecting part and a bending part connected to the connecting part, the connecting part is connected to the box body, and the bending part extends towards a side away from the box body; the bending part is configured to be connected to a support structure of an air conditioner, and the bending part is provided with a reinforcing rib, the reinforcing rib is a concave groove formed by denting an upper surface of the bending part towards a lower surface of the bending part, and multiple concave grooves are provided, and the multiple concave grooves are provided at intervals on the bending part in a direction perpendicular to an extending direction of the bending part.

Furthermore, multiple heat exchange pipes are provided, the heat exchanger further includes at least one reinforcing plate, the multiple heat exchange pipes are provided at intervals in a direction perpendicular to a length direction of the heat exchange pipes; a surface of the reinforcing plate is provided with multiple position-limiting protrusions matching with gaps between the multiple heat exchange pipes, the multiple position-limiting protrusions are stuck in the gaps between the multiple heat exchange pipes, respectively, to limit positions of the multiple heat exchange pipes spaced along a direction perpendicular to the length direction of the heat exchange pipes.

Furthermore, each of the position-limiting protrusions includes a limiting block provided on the surface of the reinforcing plate; and/or, each of the position-limiting protrusions includes a position-limiting convex hull formed by denting the reinforcing plate towards the heat exchange pipe.

Furthermore, each of the position-limiting protrusions includes a position-limiting convex hull formed by denting the reinforcing plate towards the heat exchange pipes, and two sides of the position-limiting convex hull are both provided with second openings, respectively, each of the second openings extends along the length direction of the heat exchange pipes, and two end faces, facing the second openings respectively, of the limiting convex hull abut against the heat exchange pipes at both sides of the position-limiting convex hull respectively.

Furthermore, the position-limiting convex hull includes a bottom wall and two side walls provided at two sides of the bottom wall, the two side walls are respectively connected to the reinforcing plate; and end faces formed by the two side walls and the bottom wall along the length direction of the heat exchange pipes form the second openings respectively, and abut against the heat exchange pipes.

Furthermore, multiple position-limiting protrusion groups are provided along a direction perpendicular to the length direction of the heat exchange pipes, and at least one heat exchange pipe is clamped between adjacent two position-limiting protrusion groups; one position-limiting protrusion group includes one position-limiting protrusion; or one position-limiting protrusion group includes multiple limit convex portions spaced along the length direction of the heat exchange pipes.

Furthermore, the reinforcing plate includes a plate body, the plate body includes a first edge and a second edge that are opposite to each other; the reinforcing plate further includes a first position-limiting flange bent and extended from the first edge towards a first face of the plate body, and a second position-limiting flange bent and extended from the second edge towards the first side of the plate body; the multiple heat exchange pipes are clamped between the first position-limiting flanges and the second position-limiting flange, and two outermost heat exchange pipes of the multiple heat exchange pipes are respectively in contact with the first position-limiting flange and the second position-limiting flange.

Furthermore, the plate body is in a quadrilateral shape, the plate body further includes a third edge and a fourth edge that are opposite to each other, the reinforcing plate further includes a first reinforcing flange bent and extended from the third edge in a direction away from the first face of the plate body, and a second reinforcing flange bent and extended from the fourth edge in a direction towards the first face of the plate body.

Furthermore, the plate body extends in a direction perpendicular to the length direction of the heat exchange pipes; and/or, the plate body is welded to the heat exchange pipes.

Furthermore, the heat exchange pipes has a first surface and a second surface that are opposite to each other, and the first surface is provided with at least one reinforcing plate; and/or the second surface is provided with at least one reinforcing plate.

Furthermore, the first surface is fixed with multiple reinforcing plates provided at intervals the length direction of the heat exchange pipes; and/or, the second surface is fixed with multiple reinforcing plates provided at intervals along the length direction of the heat exchange pipes.

Furthermore, the heat exchanger further includes a heat dissipation plate, the heat dissipation plate is fixed on the heat exchange pipes, and the heat dissipation plate is at a first preset distance from the reinforcing plate.

Furthermore, a thickness of the heat dissipation plate is greater than a size of the reinforcing plate along a thickness direction of the heat dissipation plate; and/or, the heat dissipation plate is welded on the heat exchange pipes.

Furthermore, the electronic control box is a sealed electronic control box.

The present invention further provides an air conditioning outdoor unit, including a casing and the electric control box in the above technical solutions, where the electric control box is fixed inside the casing.

This application further provides an air conditioner, including an air conditioning indoor unit and the air conditioning outdoor unit in the above technical solutions. The air conditioning outdoor unit is communicated with the entire indoor air conditioner unit through a pipeline used for a heat exchange media to flow.

This application further provides a method for assembling an electric control box, which includes the following steps:

providing a box body, a box cover, a mounting plate, and a heat exchanger;

fixing the mounting plate and the heat exchanger by threaded connection;

placing the fixed mounting plate and the heat exchanger inside the box body;

fixing the mounting plate and the box body by threaded connection;

placing the box cover on the box body and connecting the box cover to the box body.

The present application further provides a method for assembling an electric control box, including the following steps:

providing a box body, a box cover, a mounting plate, and a heat exchanger, and a top end of the box body has a first opening;

installing the heat exchanger inside the box body, and the top end of the box body has the first opening;

installing the mounting plate inside the box body and above the heat exchanger;

fixing the mounting plate and the heat exchanger by threaded connection;

fixing the mounting plate and the box body by threaded connection;

placing the box cover on the box body and connecting the box cover to the box body.

BRIEF DESCRIPTION OF THE DRAWINGS

FIG. 25 is another schematic flowchart of a method for assembling an electric control box according to an embodiment of the present application.

DETAILED DESCRIPTION

In related technologies, electric control box is generally used to accommodate an electric control system including a device such as an air conditioning outdoor unit. For example, electrical devices such as a circuit board, a compressor capacitor, an outdoor fan capacitor, and a wiring terminal are assembled in an electronic control box. An electronic control box generally includes a shell and various components provided inside the shell. However, there are a large number of components inside the electric control box, and the assembly manners between components and between components and the electric control box are complicated, resulting in low automatic assembly degree between components and between components and the electric control box, and poor production efficiency.

In view of this, in embodiments of the present application, a mounting plate and a heat exchanger are connected by screw-thread fitting of a first fastener and corresponding connecting holes, and the mounting plate and a shell are connected by screw-thread fitting of a second fastener and corresponding connecting holes. In this way, during actual assembly, the mounting plate and the heat exchanger are placed in a shell, and the heat exchanger is located between the mounting plate and an inner bottom face of the shell, the mounting plate is connected with the heat exchanger by screw-thread fitting, and then the mounting plate is connected with the shell by screw-thread fitting, thereby achieving the assembly of an electric control box. Therefore, in some embodiments, the present application may simplify the way of assembling the electric control box, and may the degree to which the electric control box may be automatically assembled, and thus the production efficiency may be improved.

The following will clearly and completely describe the technical solutions in the embodiments of the present application in conjunction with the accompanying drawings in the embodiments of the present application. Obviously, the described embodiments are merely a part rather than all of the embodiments of the present application. All other embodiments obtained by ordinary skilled people in the art based on the embodiments of the present application without creative efforts fall within the scope of protection of the present application.

Figure 3:
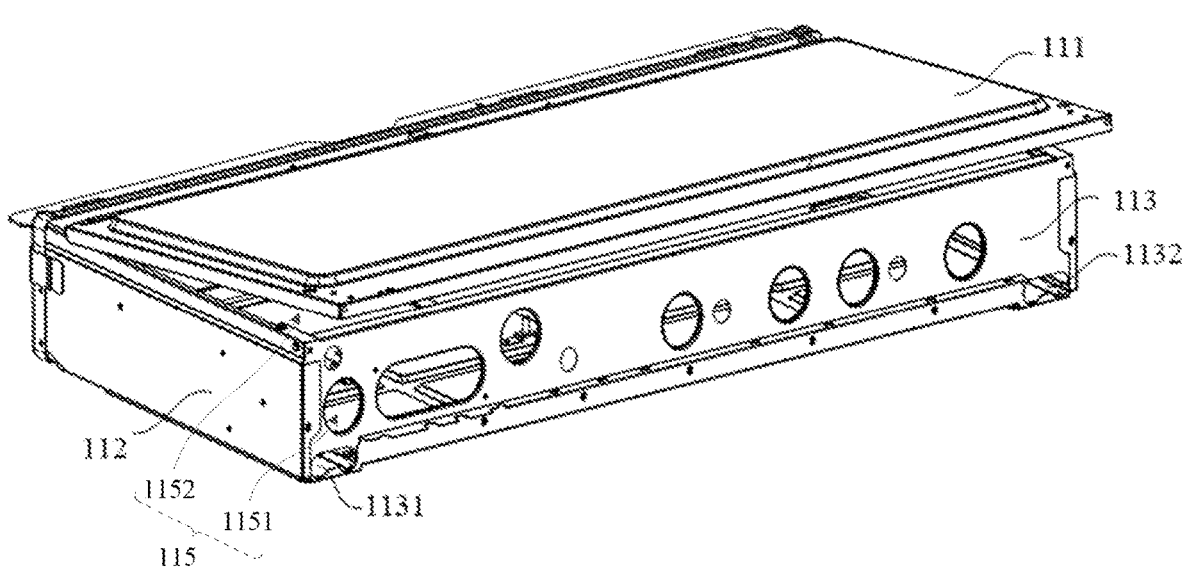
FIG. 3 is a structural schematic diagram in which a shell in an electric control box is in a semi-open state according to an embodiment of the present application.
Figure 4:
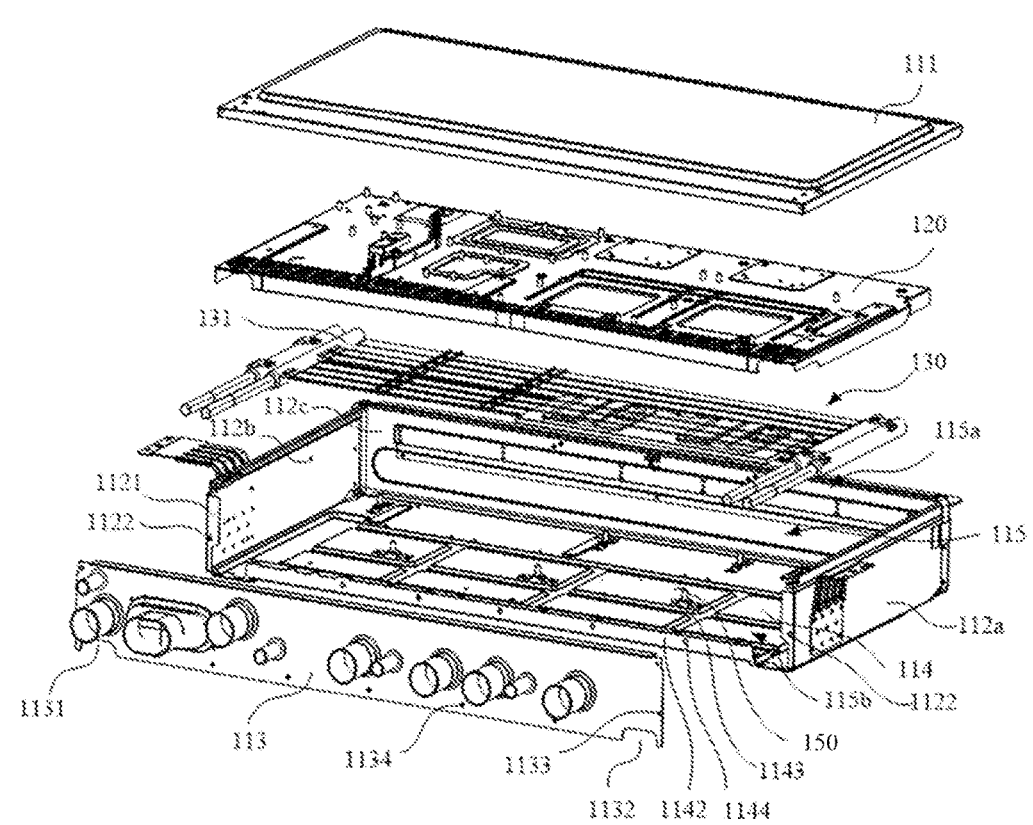
FIG. 4 is an exploded schematic diagram of an electric control box according to an embodiment of the present application.
Figure 5:
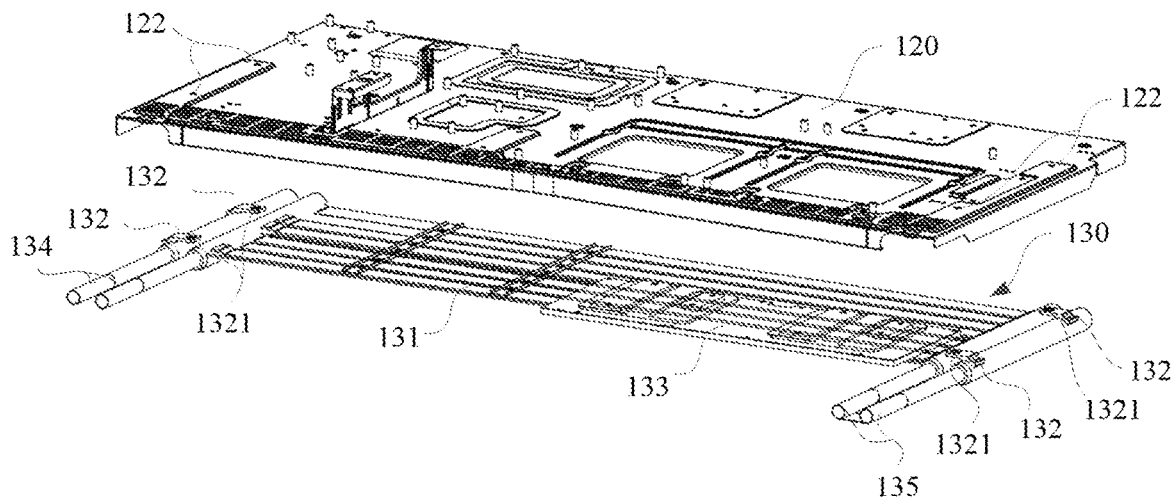
FIG. 5 is a structural schematic diagram in which a heat exchanger and a mounting plate in an electric control box are disassembled according to an embodiment of the present application.
Figure 6:
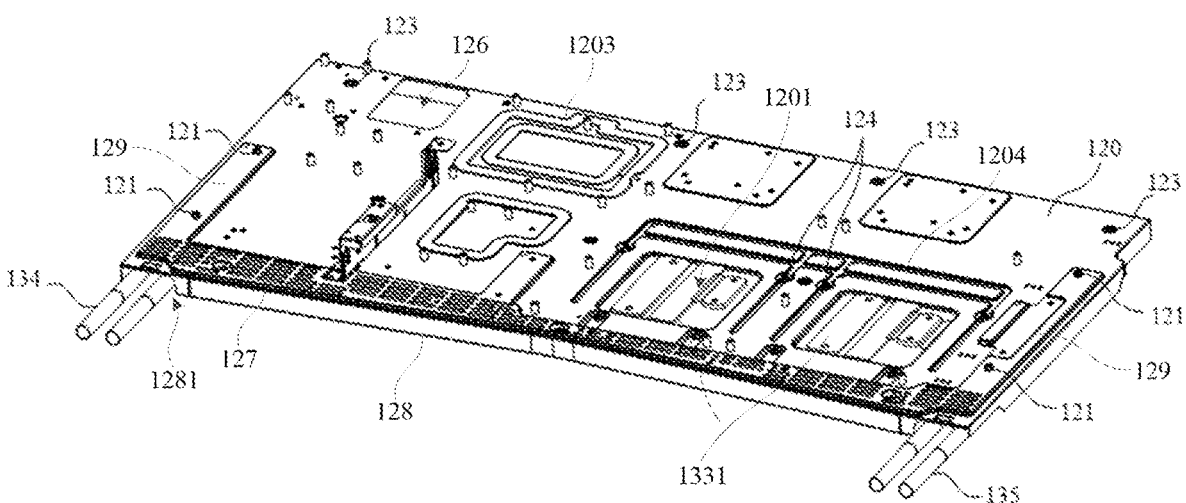
FIG. 6 is a structural schematic diagram in which a heat exchanger and a mounting plate in an electric control box are assembled according to an embodiment of the present application.

As shown in FIGS. 1 to 9, an electric control box 100 provided in this embodiment may include: a shell 110, a mounting plate 120, and a heat exchanger 130, the mounting plate 120 and the heat exchanger 130 are connected by screw-thread fitting of a first fastener 121 (as shown in FIG. 6) and corresponding connecting holes (such as a first connecting hole 1321 and a second connecting hole 122 in FIG. 5).

Figure 2:
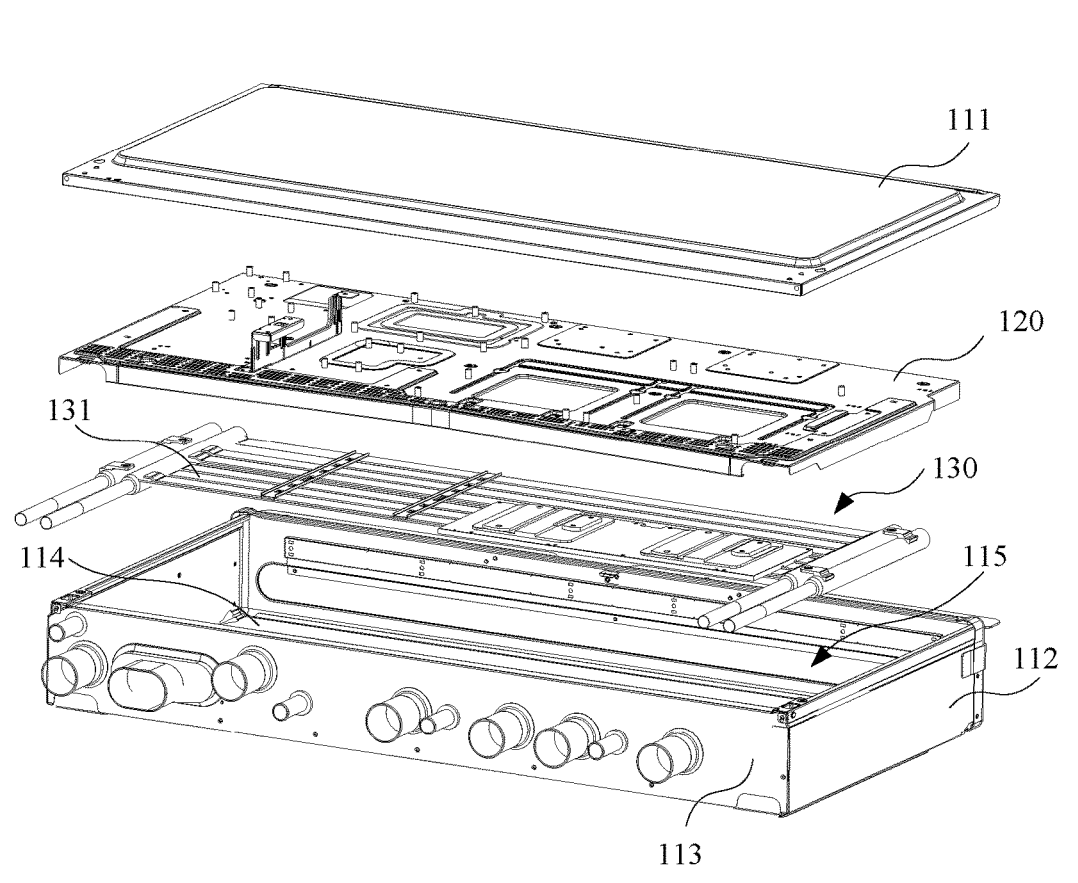
FIG. 2 is an exploded schematic diagram of a partial structure of an electric control box according to an embodiment of the present application.
Figure 7:
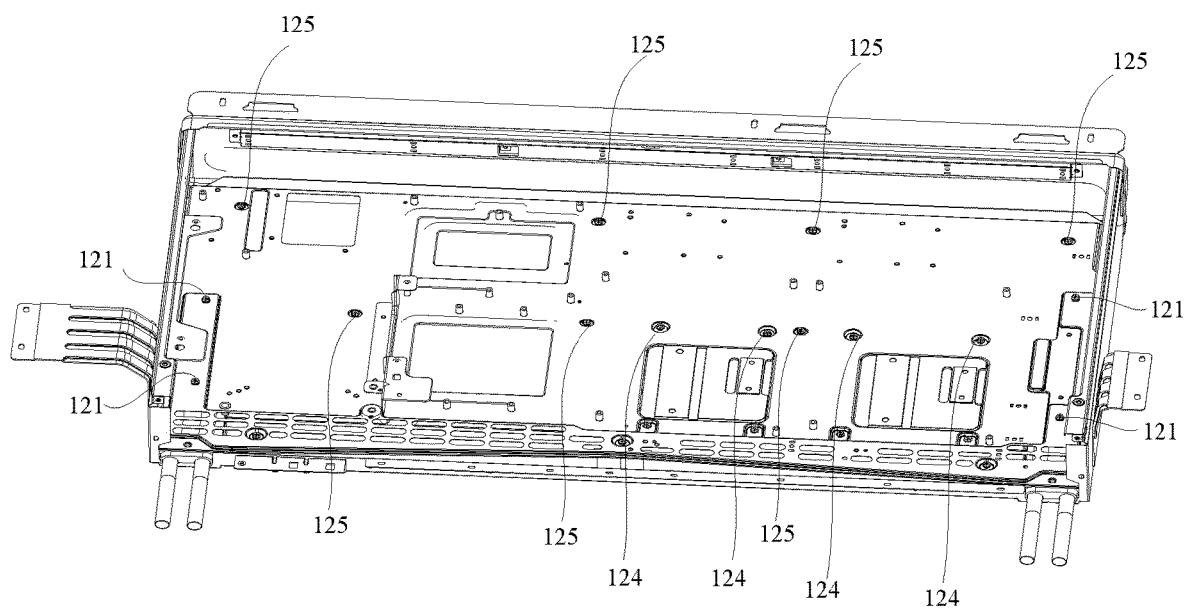
FIG. 7 is a schematic structural diagram in which a heat exchanger and a mounting plate in an electric control box are assembled and then placed in a box body according to an embodiment of the present application.

As shown in FIGS. 2 and 3, the mounting plate 120 and the heat exchanger 130 are located inside the shell 110, and the heat exchanger 130 is located between the mounting plate 120 and an inner bottom face of the shell 110, the mounting plate 120 and the shell 110 are connected by screw-thread fitting of a second fastener 125 (as shown in FIG. 7) and corresponding connecting holes (such as a third connecting hole 123 and a threaded hole in FIG. 6).

In some embodiments, as shown in FIG. 3, the shell 110 includes a box cover 111 and a box body 112, the box cover 111 is connected to the box body 112. As shown in FIG. 4, the box body 112 may be provided with a holding chamber 115 having a first opening 115a, and the box cover 111 covers the first opening 115a, the mounting plate 120 is provided opposite to the box cover 111, the heat exchanger 130 is provided opposite to a bottom of the box body 112, and the mounting plate 120 is in threaded connection with the bottom of the box body 112.

In this way, the mounting plate 120 and the heat exchanger 130 are located inside the holding chamber 115 of the box body 112, the heat exchanger 130 is provided opposite to the bottom of the box body 112, the mounting plate 120 is in threaded connection with the bottom of the box body 112, the mounting plate 120 is provided opposite to the box cover 111 and the box cover 111 covers the first opening 115a of the box body 112 and is connected to the box body 112, thereby achieving the integral assembly of the electric control box 100.

The electric control box 100 in this embodiment of the present application may be, for example, a sealed electric control box. In this way, other foreign matters such as water drops and dust can be prevented from entering the electric control box to avoid the damage to electronic devices in the electric control box, thereby achieving the effects of water resistance, dust prevention, and corrosion prevention.

The heat exchanger 130 in this application can be a microchannel heat exchanger. The microchannel heat exchanger includes at least two sets of microchannels. The at least two sets of microchannels include multiple first microchannels for the flow of a first refrigerant flow and multiple second microchannels for the flow of a second refrigerant flow, the second refrigerant flow absorbs heat from the first refrigerant flow to make the first refrigerant flow cold, or the first refrigerant flow absorbs heat from the second refrigerant flow to make the second refrigerant flow cold.

The microchannel heat exchanger in embodiments of this application may also serve as an economizer for an air conditioner. In this way, the microchannel heat exchanger can be used not only to cool electronic devices inside the electronic control box, and can also be used as an economizer, thereby avoiding the need to assemble another economizer outside the electronic control box, simplifying the structure of the air conditioner, saving space, and also saving costs.

In some embodiments, as shown in FIG. 4, the bottom of the box body 112 may be provided with a mounting plate fixing member 150, the mounting plate fixing member 150 is provided with a threaded hole coaxial with the mounting plate fixing member 150. A third connecting hole 123 is provided in the mounting plate 120, the third connecting hole is disposed corresponding to the threaded hole, and the mounting plate 120 and the box body 112 are in threaded connection by screw-thread fitting of a second fastener 125 and the third connecting hole 123 as well as the threaded hole.

The threaded hole in the mounting plate fixing member 150 located at the bottom of the box body 112 corresponds to the third connecting hole 123 in the mounting plate 120, the threaded hole and the third connecting hole 123 can be in screw-thread fitting through the second fastener 125, so as to achieve the connection of the mounting plate 120 to the bottom of the box body 112 by screw-thread fitting, this may help to improve the assembly efficiency between the mounting plate 120 and the bottom of the box body 112.

In some embodiments, there may be multiple mounting plate fixing members 150 and multiple third connecting holes 123, and the multiple mounting plate fixing members 150 may be provided at intervals on the bottom of the box body 112 along a length direction of the electric control box 100. By providing multiple mounting plate fixing members 150 at the bottom of the box 112 and multiple third connecting holes 123 of the mounting plate 120, and arranging the multiple mounting plate fixing members 150 at intervals on the bottom of the box 112 along the length direction of the electric control box 100, the reliability of the connection between the mounting plate 120 and the bottom of the box 112 can be improved in some embodiments, and the failure of the connection between the mounting plate 120 and the bottom of the box 112 can be avoided.

In addition, the heat exchanger 130 may further include an avoidance space (not shown) for the mounting plate fixing member 150 to pass through. By providing the avoidance space on the heat exchanger 130 for the mounting plate fixing member 150 to pass through, it can be ensured that the mounting plate fixing member 150 at the bottom of the box body 112 passes through the avoidance space on the heat exchanger 130 and is in threaded connection with the mounting plate 120, thereby ensuring the reliability of the connection between the mounting plate 120 and the bottom of the box body 112 in this embodiment.

It can be understood that in some embodiments, a mounting seat 1143 (as shown in FIG. 4) may also be provided between the mounting plate fixing member 150 and the bottom of the box body 112. Specifically, the mounting seat 1143 is provided on an inner bottom wall of the box body 112, and the mounting plate fixing member 150 is provided on a side of the mounting seat 1143 away from the bottom of the box body 112. Moreover, as an optional implementation, a gap can be formed between one face of the mounting seat 1143 facing the inner bottom wall of the box body 112 and the inner bottom wall of the box body 112. In this way, when the mounting plate fixing member 150 passes through the heat exchanger 130 and is connected with the mounting plate 120, the gap can avoid direct contact between the heat exchanger 130 and the inner bottom wall of the box body 112, thereby avoiding unnecessary heat transfer between the heat exchanger 130 and the box body 112.

As shown in FIG. 4, in some embodiments, the box body 112 includes a box main body and a packaging plate 113. Specifically, the box main body includes a bottom plate 114 and a side plate, and the side plate can enclose a part of an outer peripheral edge of the bottom plate 114, so that a side of the box main body has a side first opening 115b. Moreover, the packaging plate 113 is provided at the side first opening 115b, and the packaging plate 113 and the side plate are located on a same side of the bottom plate 114.

In this way, the bottom plate 114 and the side plate enclose to form the box main body having the side opening 115b, the packaging plate 113 is provided at the side opening 115b of the box main body, therefore, the box body 112 having a first opening 115a can be assembled and formed, so that a box cover 111 covers the first opening 115a of the box body 112, thereby assembling to form a sealed shell 110.

Specifically, continuing to refer to FIG. 4, the side plate may include a right side plate 112a, a left side plate 112b, and a rear side plate 112c, where the right side plate 112a and the left side plate 112b are provided opposite to each other, the rear side plate 112c and the packaging plate 113 are provided opposite to each other. The right side plate 112a, the left side plate 112b, the rear side plate 112c, and the packaging plate 113 enclose together to form the side plate.

Figure 8:
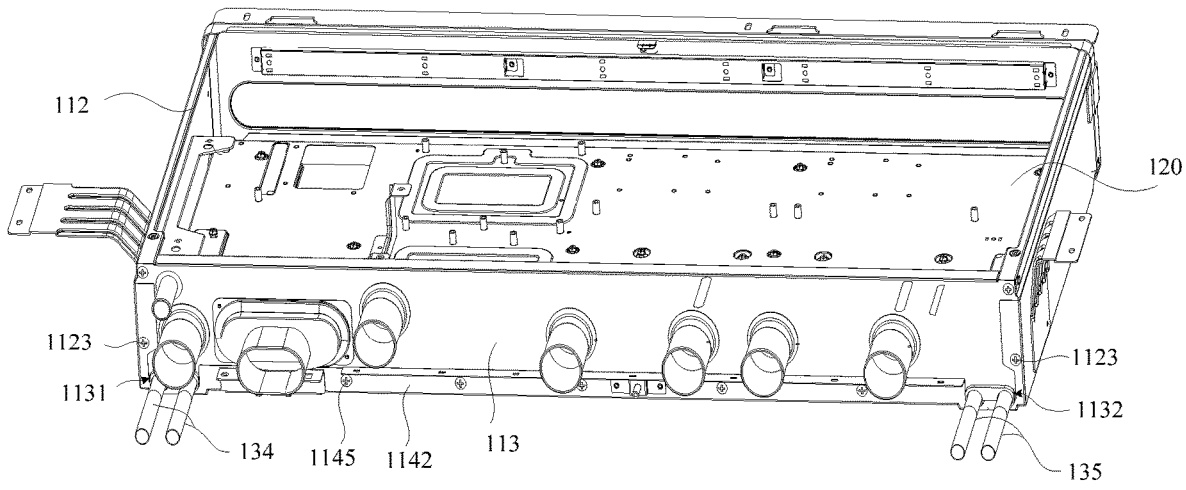
FIG. 8 is a structural schematic diagram in which a packaging board is assembled to a box body in an electronic control box according to an embodiment of the present application.

In addition, continuing to refer to FIG. 4, in some embodiments, a first bending part 1121 may be provided on an edge of the side plate (the right side plate 112*a* or the left side plate 112*b*) facing the packaging plate 113, and a fourth connecting hole 1122 may be provided in the first bending part 1121, the packaging plate 113 may be further provided with a fifth connecting hole 1133, and the side plate is connected to the packaging plate 113 by screw-thread fitting of a third fastener 1123 (as shown in FIG. 8) and the fourth connecting hole 1122 as well as the fifth connecting hole 1133.

By providing the first bending part 1121 on the edge of the side plate, making the fourth connecting hole 1122 in the first bending part 1121 correspond to the fifth connecting hole 1133 in the packaging plate 113, and performing screw-thread fitting of the fourth connecting hole 1122 and the fifth connecting hole 1133 through the third fastener 1123, the connection between the first bending part 1121 on the edge of the side plate and the packaging board 113 by screw-thread fitting is achieved, so as to improve the reliability of the connection between the side plate and the package plate 113, thereby improving the reliability of the connection between the box main body of the box body 112 and the package plate 113 in this embodiment.

In one possible implementation, continuing to refer to FIG. 4, a second bending part 1142 may be provided on an edge of the bottom plate 114 corresponding to the packaging plate 113, and a sixth connecting hole 1144 may be provided in the second bending part 1142, the packaging plate 113 may be further provided with a seventh connecting hole 1134, and the side plate is connected to the packaging plate 113 by screw-thread fitting of a fourth fastener (as shown in FIG. 8) and the sixth connecting hole 1144 as well as the seventh connecting hole 1134.

By providing the second bending part 1142 on the edge of the bottom plate 114, and making the sixth connecting hole 1144 in the second bending part 1142 correspond to the seventh connecting hole 1134 in the packaging board 113, and performing screw-thread fitting of the sixth connecting hole 1144 and the seventh connecting hole 1134 through the fourth fastener 1145, the connection between the second bending part 1142 on the edge of the bottom plate 114 and the packaging board 113 by screw-thread fitting is achieved, so as to improve the reliability of the connection between the bottom plate 114 and the packaging board 113, thereby improving the reliability of the connection between the box main body of the box body 112 and the package plate 113 in this embodiment.

In addition, as shown in FIG. 5, in some embodiments, the heat exchanger 130 may include a heat exchange pipe 131, where each of both ends of the heat exchange pipe 131 can be provided with at least one first connecting hole 1321. The mounting plate 120 may include a main body, each of both ends of the main body can be provided with at least one second connecting hole 122 opposite to the first connecting hole 1321, each of the both ends of the mounting plate 120 and each of the both ends of the heat exchanger 130 may be in threaded connection by screw-thread fitting of a first fastener 121 and the first connecting hole 1321 as well as the second connecting hole 122.

In this way, the first connecting hole 1321 at each of the both ends of the heat exchange pipe 131 of the heat exchanger 130 corresponds to the second connecting hole 122 at each of the both ends of the main body of the mounting plate 120, and the first connecting hole 1321 and the second connecting hole 122 are in threaded connection through the first fastener 121, therefore, the connection between the heat exchanger 130 and the mounting plate 120 by screw-thread fitting can be achieved, thereby improving the assembly efficiency between the heat exchanger 130 and the mounting plate 120.

As an optional implementation, each of the both ends of the heat exchange pipe 131 can also be provided with a connection member 132, and the connection member 132 is provided with the first connecting hole 1321.

Continuing to refer to FIG. 5, the heat exchanger 130 can also include a heat dissipation plate 133, the heat dissipation plate 133 is provided on the heat exchange pipe 131, and the heat dissipation plate 133 can be provided with a first assembly hole; a second assembly hole can be provided in a position of the mounting plate 120 corresponding to the first assembly hole, and the mounting plate 120 and the heat exchanger 130 are in threaded connection by screw-thread fitting of a threaded assembly component 124 and the first assembly hole as well as the second assembly hole.

In this way, the first assembly hole in the heat dissipation plate 133 of the heat exchanger 130 corresponds to the second assembly hole in the mounting plate 120, and the first assembly hole and the second assembly hole are in screw-thread fitting through the threaded assembly component 124, therefore, the threaded connection between the heat exchanger 130 and the mounting plate 120 can be achieved in some embodiments, thereby improving the assembly efficiency between the heat exchanger 130 and the mounting plate 120.

As shown in FIG. 5, in some embodiments, the heat exchanger 130 may further include an input pipe 134 and an output pipe 135. A first end of the input pipe 134 may be communicated with an inlet of the heat exchange pipe 131, and a first end of the output pipe 135 may be communicated with an outlet of the heat exchange pipe 131.

By providing the input pipe 134 and output pipe 135 on the heat exchanger, and making the input pipe 134 communicated with the inlet of the heat exchange pipe 131, and making the output pipe 135 communicated with the outlet of the heat exchange pipe 131, the heat exchange pipe 131 of the heat exchanger 130 can be in communication with the outside through the input pipe 134 and output pipe 135, for example, external cold liquid can enter the inside of the heat exchange pipe 131 through the input pipe 134, then the liquid having a temperature, generated after the cold liquid is subjected to heat exchange, flows through and out of the output pipe 135, thereby achieving the heat exchange function of the heat exchange component.

In addition, the packaging plate 113 can be provided with a first avoidance part 1131 and a second avoidance part 1132, and the input pipe 134 passes through the first avoidance part 1131 and the output pipe 135 passes through the second avoidance part 1132, and one end of the input pipe 134 may be located within the shell 110, and the other end of the input pipe 134 may be located outside the shell, and one end of the output pipe 135 may be located within the shell 110, and the other end of the output pipe 135 may be located outside the shell.

As shown in FIG. 8, there may be two input pipes 134 on the left side and two output pipes 135 on the right side, it should be understood that, in some embodiments, one of the two input pipes 134 on the left side in FIG. 8 may serve as an input pipe, the other may serve as an output pipe. Correspondingly, one of the two output pipes 135 on the right side in FIG. 8 may also serve as an input pipe, the other may serve as an output pipe. Therefore, two heat dissipation channels with opposite flow directions may be formed in the heat exchanger to ensure effective heat exchange of the heat exchanger. In the present application, the input pipe 134 and the output pipe 135 are not limited in terms of their position and number.

Figure 9:
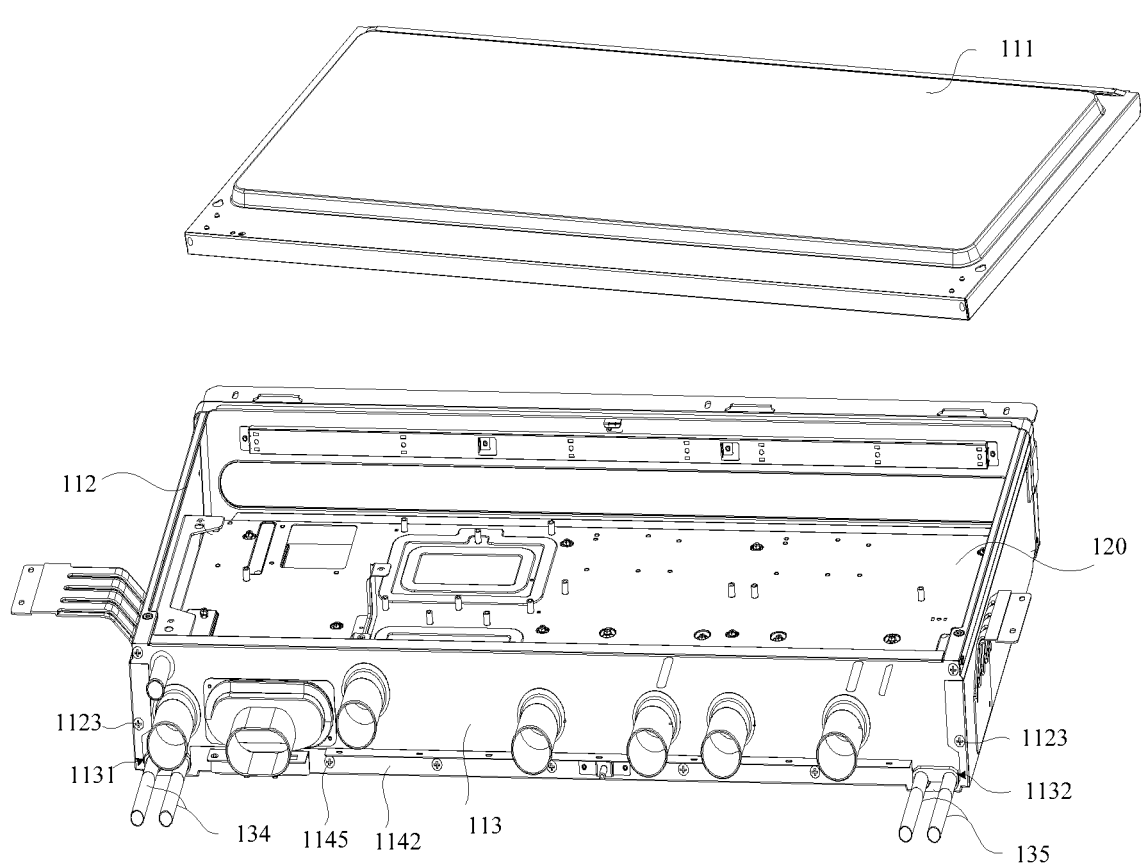
FIG. 9 is a structural schematic diagram in which a box cover and a box body of an electronic control box are assembled according to an embodiment of the present application.
Figure 10:
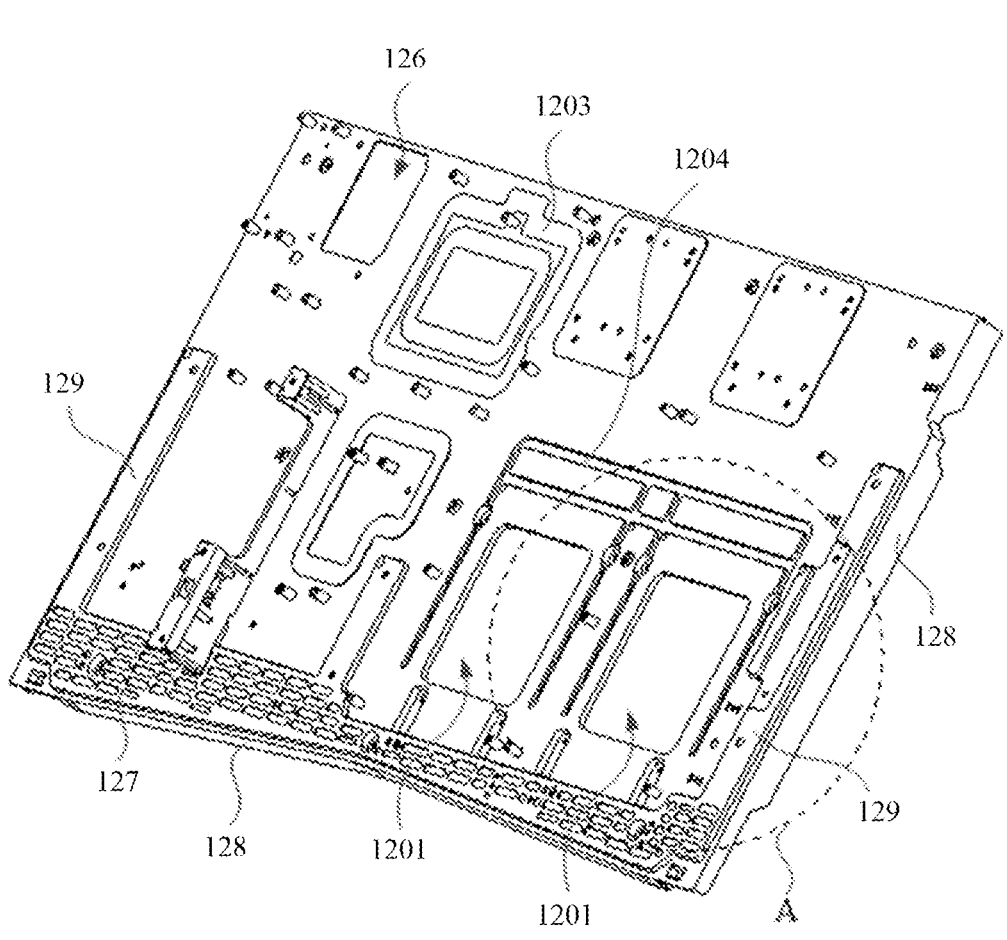
FIG. 10 is a structural schematic diagram of a mounting plate in an electric control box under a first angle of view according to an embodiment of the present application.
Figure 11:
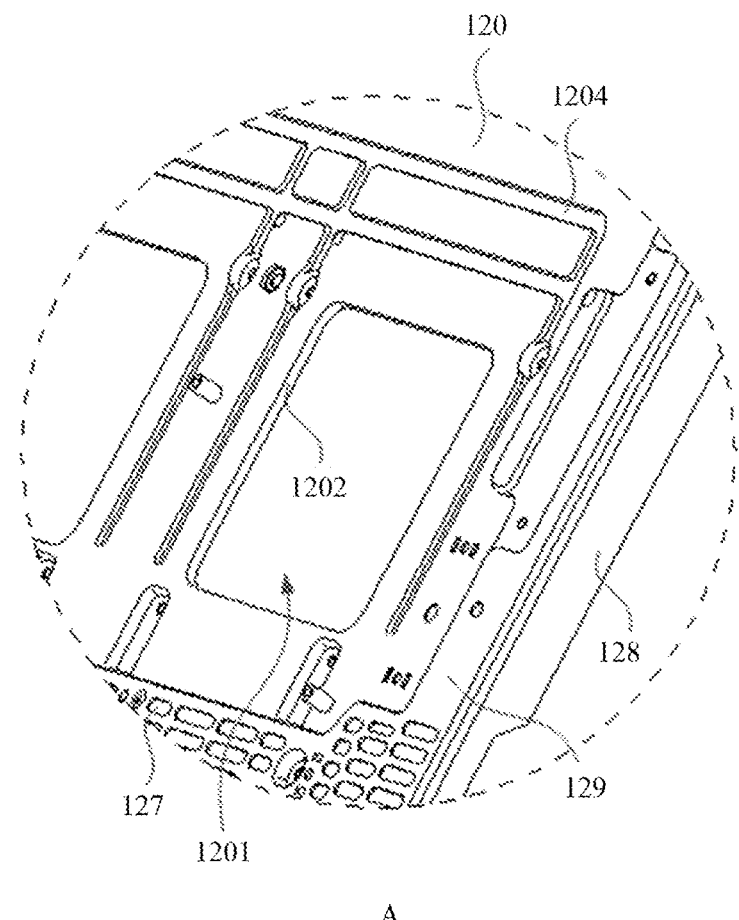
FIG. 11 is an enlarged view of area A in FIG. 10.
Figure 12:
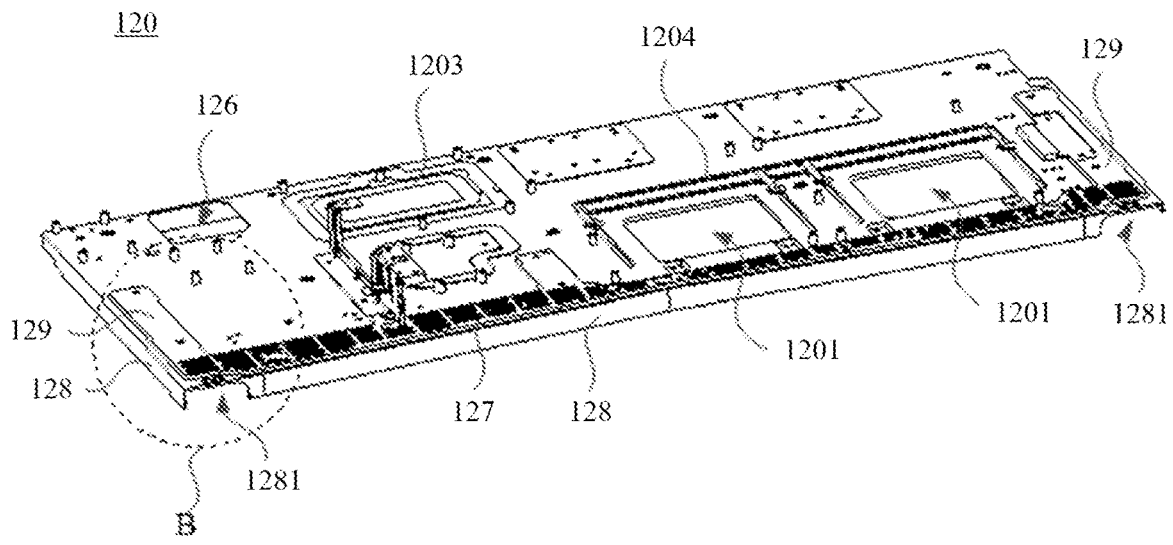
FIG. 12 is a structural schematic diagram of a mounting plate in an electric control box under a second angle of view according to an embodiment of the present application.
Figure 13:
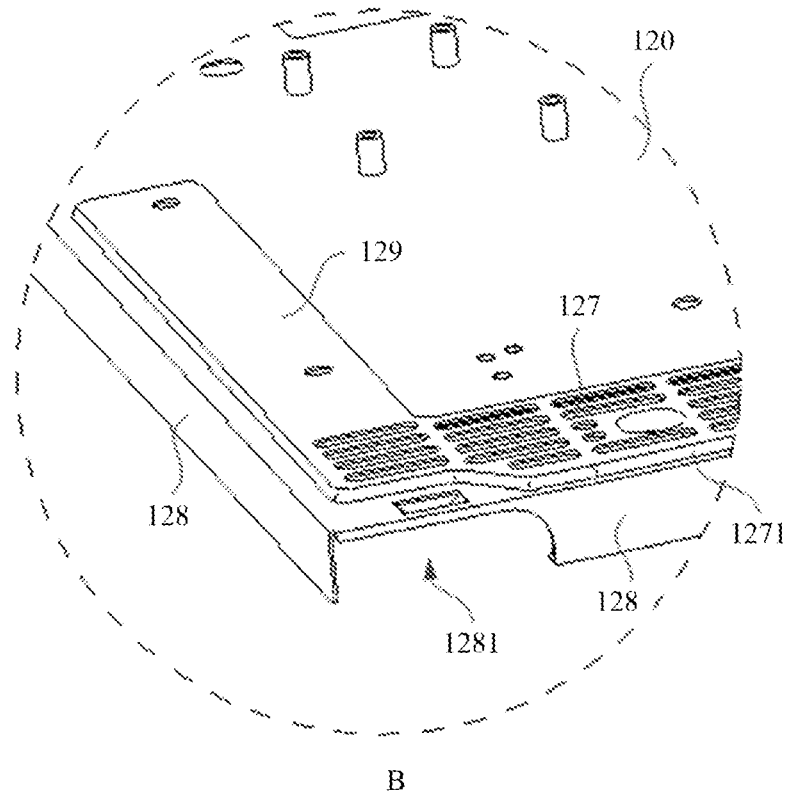
FIG. 13 is an enlarged view of area B in FIG. 12.

In addition, it should be noted that in actual use, the assembly diagram about the connection of the box cover 111 and the box body 112 is shown in FIG. 9, and the box cover 111 may cover the box body 112.

Furthermore, it can be understood that the connection between the box cover 111 and the box body 112 can be detachable, for example, the connection between the box cover 111 and the box body 112 can be threaded connection, pin connection, or snap connection, and the specific structure of the detachable connection is not limited in this embodiment.

Of course, in other embodiments, furthermore, the connection between the box cover 111 and the box body 112 can be non-detachable connection, for example, both connection ends of the box cover 111 and of the box body 112 are metallic, and in this case, both of them can be connected in a welding manner.

The electric control box in this embodiment of the present application may be a sealed electric control box, in this way, other foreign matters such as water drops and dust can be prevented from entering the electric control box to avoid the damage to electronic devices in the electric control box, thereby achieving the effects of water resistance, dust prevention, and corrosion prevention.

The heat exchanger in this application can be a microchannel (the heat exchange pipe 131) heat exchanger. The microchannel heat exchanger includes at least two sets of microchannels. The at least two sets of microchannels include multiple first microchannels for the flow of a first refrigerant flow and multiple second microchannels for the flow of a second refrigerant flow, the second refrigerant flow absorbs heat from the first refrigerant flow to make the first refrigerant flow cold, or the first refrigerant flow absorbs heat from the second refrigerant flow to make the second refrigerant flow cold.

The microchannel heat exchanger in embodiments of this application may also serve as an economizer for an air conditioner. In this way, the microchannel heat exchanger can be used not only to cool electronic devices inside the electric control box, and can also be used as an economizer, thereby avoiding the need to assemble another economizer outside the electric control box, simplifying the structure of the air conditioner, saving space, and also saving costs.

Referring to FIGS. 10 to 13 in combination with FIGS. 1 to 4, an electronic control box 100 may also include a heat exchanger 130 and a mounting plate 120, the heat exchanger 130 includes a heat exchange pipe 131 and a heat dissipation plate 133 stacked on a surface of the heat exchange pipe 131, and the heat exchange pipe 131, the heat dissipation plate 133, and the mounting plate 120 are all accommodated in a holding chamber 115 of a box body 112. For example, the heat exchange pipe 131 can be placed close to a bottom plate 114 of the box body 112 and inside the holding chamber 115 of the box body 112, the heat dissipation plate 133 can be stacked on a side of the heat exchange pipe 131 away from the bottom plate 114, the mounting plate 120 can be stacked on a side of the heat dissipation plate 133 away from the heat exchange pipe, a side of the mounting plate 120 away from the heat dissipation plate 133 is provided with electronic devices (not shown), and the electronic devices may include a fan, a filter board, an expansion board, a reactor, a module board, and other electronic devices required for the operation of the electronic control box 100.

It should be understood that, the assembling sequence of the heat exchange pipe 131, the heat dissipation plate 133, and the mounting plate 120 in the holding chamber 115 of the box body 112 may also be adjusted according to actual needs, for example, the heat exchange pipe 131, the heat dissipation plate 133 and the mounting plate 120 may be sequentially stacked in a direction from the box cover 111 to the bottom plate 114. The heat exchange pipe 131 may include one heat exchange pipe, two heat exchange pipes, or multiple heat exchange pipes, for example, one heat exchange pipe may be coiled in an "S" shape to form a heat exchange surface, and two or multiple heat exchange pipes may be provided in parallel to form a heat exchange surface, and the heat dissipation plate 133 is provided to cover the heat exchange surface formed by the arrangement of heat exchange pipes, so as to perform heat exchange with the heat exchange pipes. The mounting plate 120 is in contact with the heat dissipation plate 133, so that the heat dissipation plate 133 can cool down the electronic devices on the mounting plate 120.

The mounting plate 120 provided in this embodiment of this application includes an avoidance part, the avoidance part is used to avoid a part of a structure of the heat exchanger 130. The avoidance part includes an avoidance hole 1201 and an avoidance protrusion 129, the avoidance protrusion 129 protrudes from a plate face of the mounting part to a side facing away from the heat exchanger 130. It should be understood that, the avoidance protrusion 129 is provided on the plate face of the mounting part at a side facing away from the heat exchanger 130, that is, a concave space is formed on a side of the mounting plate 120 facing the heat exchanger 130, and the concave space may accommodate a part of the structure of the heat exchanger 130, so as to achieve a purpose of avoiding a part of the structure of the heat exchanger 130.

The electronic control box 100 provided in this embodiment of this application includes the mounting plate 120 and the heat exchanger 130, the mounting plate 120 and the heat exchanger 130 are arranged in a stacked manner, and the heat generated by electronic devices on the mounting plate 120 during operation can be transferred to the heat exchanger 130 to cool the electronic devices. By providing the avoidance part on the mounting plate for avoiding a part of the structure of the heat exchanger 130, the heat exchanger 130 and the mounting plate 120 can be smoothly assembled together. By providing the avoidance part including the avoidance hole 1201 and the avoidance protrusion 129, where the avoidance protrusion 129 may be provided by protruding from a plate face of the mounting part to a side facing away from the heat exchanger 130, the structure is simple, and the strength of the mounting plate 120 can be improved.

The heat exchanger 130 includes a heat dissipation plate 133, the heat dissipation plate 133 includes a protruding platform 1331, and the avoidance hole 1201 is disposed corresponding to the protruding platform 1331. It can be understood that, the protruding platform 1331 protrudes towards a side where the mounting plate 120 is located, therefore, on the one hand, the avoidance hole 1201 can avoid the protruding platform 1331 on the heat dissipation plate 133; on the other hand, the avoidance hole 1201 enables the protruding platform 1331 on the heat dissipation plate 133 to pass through the avoidance hole 1201, so as to contact electronic devices provided on the mounting plate 120, thereby cooling the electronic devices better.

The protruding platform 1331 may correspond to a middle area of the mounting plate 120, and the avoidance hole 1201 can be provided in the middle area of the mounting plate 120, thereby preventing too low edge strength of the mounting plate 120 if the avoidance hole 1201 is disposed close to an edge of the mounting plate 120, which easily results in deformation and damage.

At least two protruding platforms 1331 are included, for example, two or more protruding platforms 1331 may be provided according to actual needs, and two or more protruding platforms 1331 may be provided in parallel on the heat dissipation plate 133. At least two avoidance holes 1201 are included, for example, two or more avoidance holes 1201 may be provided according to actual needs, and two or more protruding platforms 1331 may be provided in parallel on the mounting plate 120. It should be understood that the avoidance hole 1201 and the protruding platform 1331 to be avoided are the same in number and are corresponding to each other in position, so that two or more protruding platforms 1331 and two or more avoidance holes 1201 are disposed in one-to-one correspondence.

The contour of an edge of the avoidance hole 1201 can be located outside the cross-sectional contour of the protruding platform 1331 on the mounting plate 120, so that the protruding platform 1331 passes through the avoidance hole 1201. Electronic devices are usually disposed on a side of the mounting plate 120 away from the heat dissipation plate 133, and the protruding platform 1331 may directly contact electronic devices after passing through the avoidance hole 1201 to facilitate better cooling down electronic devices, thereby ensuring the normal operation of electronic devices. The edge contour of the avoidance hole 1201 can come into contact with an outer circumferential surface of the protruding platform 1331, or there may be a gap between the edge contour of the avoidance hole 1201 and the outer circumferential surface of the protruding platform 1331.

At least a portion of the edge of the avoidance hole 1201 is provided with a first edgefold 1202, and the first edgefold 1202 extends along an axial direction of the avoidance hole 1201 to be supported at a side of the protruding platform 1331. In some embodiments, the first edgefold 1202 may improve the structural strength and stiffness of the edge of the avoidance hole 1201, and may enhance the ability of the edge of the avoidance hole 1201 to resist deformation and cracking.

In one possible implementation, the first edgefold 1202 can be provided on a relatively weak portion of the edge of the avoidance hole 1201, or the first edgefold 1202 can be provided on a portion, which is easy to be squeezed, of the edge of the avoidance hole 1201 to increase the structural strength and stiffness of the relatively weak portion or the easily squeezed portion of the edge of the avoidance hole 1201.

In some embodiments, the first edgefold 1202 can be provided on the circumferential edge of the avoidance hole 1201, and may improve the structural strength and stiffness of each portion of the circumferential edge of the avoidance hole 1201, and may also improve the structural strength and stiffness of the entire mounting plate 120, making mounting plate 120 more reliable.

In some embodiments, the first edgefold 1202 has a folded direction away from a side where electronic devices are located. On the one hand, the first edgefold 1202 can be prevented from interfering with the assembling of electronic devices, thereby facilitating the smooth assembling of electronic devices onto the mounting plate 120; on the other hand, the first edgefold 1202 may limit the distance between a side of the mounting plate 120 away from electronic devices and other components on the side of the mounting plate 120 away from the electronic devices. In some embodiments, the folded direction of the first edgefold 1202 may also be provided to be towards a side where electronic devices are located according to actual needs, so as to match with the connection structure of the electronic devices.

In some embodiments, the width of the first edgefold 1202 may be provided according to actual needs. When the heat dissipation plate 133 is provided at a side of the mounting plate 120 away from electronic devices, the edge of an end of the first flange 1202 away from the electronic devices may abut against a side of the heat dissipation plate 133 facing the mounting plate 120, so as to limit the distance between the heat dissipation plate 133 and the mounting plate 120.

The heat exchanger 130 further includes an input pipe 134 and an output pipe 135, two ends of a heat dissipation pipe group are respectively communicated with the input pipe 134 and the output pipe 135, a refrigerant inlet pipe section and the output pipe 135 are used to allow a refrigerant to flow inside the heat dissipation pipe group so as to take away heat. There may be two avoidance protrusions 129, and the two avoidance protrusions 129 are provided corresponding to the input pipe 134 and the output pipe 135 respectively, so that a side of the mounting plate 120 facing the heat exchanger 130 has sufficient space for accommodating the output pipe 135 and the input pipe 134, so as not only to ensure the smooth assembling of the output pipe 135 and input pipe 134 of the heat exchanger 130, but also to improve the structural strength and stiffness of the mounting plate 120 in the region of avoidance protrusion 129.

In some embodiments, the input pipe 134 and the output pipe 135 may correspond to two opposite sides of the mounting plate 120 respectively, and avoidance protrusions 129 are provided on two opposite sides of the mounting plate 120, respectively, so as not only to facilitate the full flow of a refrigerant in the heat dissipation pipe group, but also to enhance the structural strength of the two opposite sides of the mounting plate 120.

A ventilation grid 127 can be provided between two avoidance protrusions 129 of the mounting plate 120, for example, the ventilation grid 127 includes multiple grid holes in array arrangement, and the ventilation grille 127 facilitates convection of air at two sides of the mounting plate 120, thereby facilitating heat dissipation and cooling of electronic devices assembled on the mounting plate 120.

A bending part 1271 surrounding the ventilation grid 127 is provided around the ventilation grid 127, for example, when the ventilation grid 127 is a square area, the bent portion 1271 surrounds the contour of the square area; when the ventilation grid 127 is an irregular area, the bending part 1271 surrounds the contour of the irregular area. Since the ventilation grid 127 includes multiple grid holes in array arrangement in the mounting plate 120, the structural strength and stiffness of the mounting plate 120 in the area of the ventilation grid 127 may be reduced. Therefore, providing the bending part 1271 surrounding the ventilation grid 127 around the ventilation grid 127 may be beneficial for improving the structural strength and stiffness of the area around the ventilation grid 127, so as to ensure the structural stability of the mounting plate 120 in the region of the ventilation grid 127.

The bending part 1271 may be bent towards a side away from the heat exchanger 130, so that a plane where the ventilation grid 127 is located protrudes towards the side away from the heat exchanger 130. Thus, the space on the side of the ventilation grid 127 away from electronic devices can be increased, thereby facilitating the assembling of other components on the side of the ventilation grille 127 away from the electronic devices. For example, it is beneficial to increase the assembling space of the heat exchanger 130 and the space for buffering airflow.

The mounting plate 120 can approximate a rectangular structure, one side of the mounting plate 120 can be a first edge of the mounting plate 120, the ventilation grille 127 can be arranged in an area close to the first edge of the mounting plate 120, and two avoidance protrusions 129 are respectively located at two ends of the first edge. For example, the ventilation grille 127 can be extended from one avoidance protrusion 129 to another avoidance protrusion 129, thereby conducive to increasing the area of the ventilation grille 127 and improving the air convection efficiency on both sides of the mounting plate 120. Moreover, the arrangement of the ventilation grille 127 close to the first edge can avoid the installation position of the ventilation grille 127 from affecting the installation of other electronic devices.

In some embodiments, an edge of a side of the mounting plate 120 near the ventilation grid 127, i.e. a first edge, is provided with a second edgefold 128. Since the ventilation grid 127 is provided near the first edge, the structural strength and stiffness of the ventilation grid 127 are relatively low, therefore, providing the second edgefold 128 at the first edge is beneficial for improving the structural strength and stiffness of the first edge of the mounting plate 120, avoiding deformation or cracking of the first edge of the mounting plate 120, in which such deformation or cracking may affect the structure of the ventilation grille 127. The second edgefold 128 can extend towards the heat exchanger 130, and thus easily plays a role of position limitation between the heat exchanger 130 and the mounting plate 120.

In some embodiments, each of other edges of the mounting plate 120 may also be provided with the second edgefold 128, for example, the second edgefold 128 may surround a circumferential edge of the mounting plate 120, and the second edgefold 128 may be bent away from a side where electronic devices are located. Therefore, the structural strength and stiffness at each portion of the circumferential edge of the mounting plate 120 can be improved, therefore, this further improves the reliability of the mounting plate 120 and may better limit the position of the heat exchanger 130 located at a side of the mounting plate 120 away from electronic devices.

The second edgefold 128 is provided with an avoidance gap 1281 for each of the input pipe 134 and the output pipe 135 of the heat exchanger 130 to extend out. For example, the avoidance gap 1281 may be provided at a position where each of the output pipe 135 and the input pipe 134 can extend out in a straight-line manner, and may also be provided at other positions where each of the output pipe 135 and the input pipe 134 may extend out of the avoidance gap 1281 in a bend manner according to actual needs. The avoidance gap 1281 not only can ensure each of the output pipe 135 and the input pipe 134 to extend out, but also can limit the positions of the output pipe 135 and the input pipe 134.

A reinforcing rib may be provided on the mounting plate 120, for example, the reinforcing rib includes at least one of a convex rib 1204 and a concave rib 1203, and the concave rib 1204 or the convex rib 1203 can extend on the mounting plate in a curved-line manner, meander-line manner, or straight-line manner. For example, the concave rib 1204 or the convex rib 1203 may be provided at a gap area of the mounting plate 120, and may also be provided between the mounting plate 120 and an electronic device. The concave rib 1204 or the convex rib 1203 can improve the structural strength and stiffness of the plane area, which is used for installing the electronic device, of the mounting plate 120.

The concave rib 1204 or the convex rib 1203 may extend in a circumferential direction of the electronic device. For example, the concave rib 1204 or the convex rib 1203 may extend in a circumferential direction of the electronic device to form a closed ring shape, and may also extend to form semi enclosed structure. On the one hand, the concave rib 1204 or the convex rib 1203 improve the structural strength and stiffness of the area, which is used for installing the electronic device, of the mounting plate 120; On the other hand, the convex rib 1203 can support the electronic device, and the concave rib 1204 can avoid the structure, which easily results in interference, of the electronic device.

The concave rib 1204 or the convex rib 1203 may extend in the circumferential direction of the avoidance hole 1201. For example, the concave rib 1204 or the convex rib 1203 may extend in the circumferential direction of the avoidance hole 1201 to form a closed ring shape, and may also extend to form semi enclosed structure. On the one hand, the concave rib 1204 or the convex rib 1203 improve the structural strength and stiffness of the area, which is located around the avoidance hole 1201, of the mounting plate 120. On the other hand, the convex rib 1203 and the concave rib 1204 may be beneficial for supporting or avoiding the electronic device assembled at or around the avoidance hole 1201.

A ventilation hole 126 is further provided in the mounting plate 120. For example, the ventilation hole 126 may be provided near an edge of one side of the mounting plate 120. The ventilation hole 126 can be provided with a fan, the fan can drive air through the ventilation hole 126 to increase the flow of air inside the electronic control box 100 and improve heat dissipation efficiency.

An edge of the ventilation hole 126 can be provided with a third edgefold (not shown in figures), the third edgefold may increase structural strength and stiffness of the edge of the ventilation hole 126, so as to ensure the stability and reliability of assembling of the fan and prevent deformation or cracking of the edge of ventilation hole 126 caused by vibration of the fan.

In some embodiments, the third edgefold may be provided on an edge, which is relatively weak, of the ventilation hole 126, or the third edgefold may be provided on an edge, which is easily pressed, of the ventilation hole 126, so as to increase structural strength of the relatively weak edge of the ventilation hole 126 and the easily pressed edge of the ventilation hole 126. In some embodiments, a circumferential edge of the ventilation hole 126 is provided with a third edgefold, so that the structural strength and stiffness of each portion of the circumferential edge of the ventilation hole 126 can be further improved, thereby further ensuring the stability and reliability of assembling of the fan, and at the same time, further improving the reliability of the mounting plate 120.

In some embodiments, the third edgefold may be bent towards a side where electronic devices are located. In a specific implementation, when the heat exchanger 130 is provided at a side of the mounting plate 120 away from electronic devices, the airflow at the side of the mounting plate 120 away from electronic devices may be smoothly guided to a side of the mounting plate 120 on which electronic devices are assembled through the ventilation hole 126 under the guidance of the fan so as to cool down the electronic devices. In this case, the bending of the third edgefold towards the side where the electronic devices are located can avoid blocking airflow from entering the ventilation hole 126, thereby ensuring smooth airflow and improving cooling efficiency. The width of the third edge-fold can be provided according to actual needs, without obstructing the assembling of the fan and the flow of the airflow.

In some embodiments, the third edgefold may also be bent towards a side away from electronic devices according to actual needs, and an airflow at the ventilation hole 126 may also flow from the side of the mounting plate 120 on which the electronic devices are assembled to the side of the mounting plate 120 away from the electronic devices.

Figure 14:
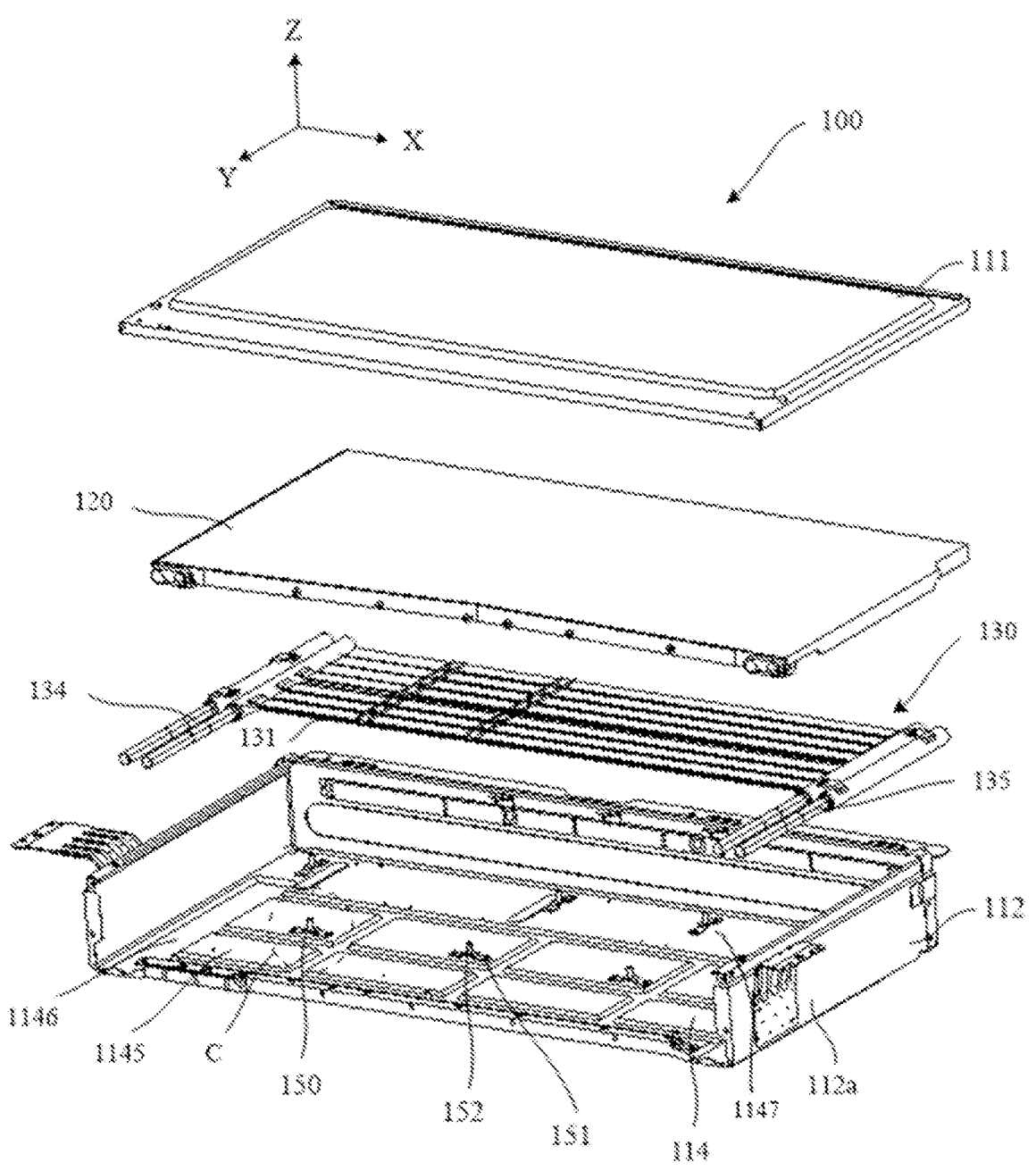
FIG. 14 is an exploded structural schematic diagram of an electronic control box according to an embodiment of the present application.
Figure 15:
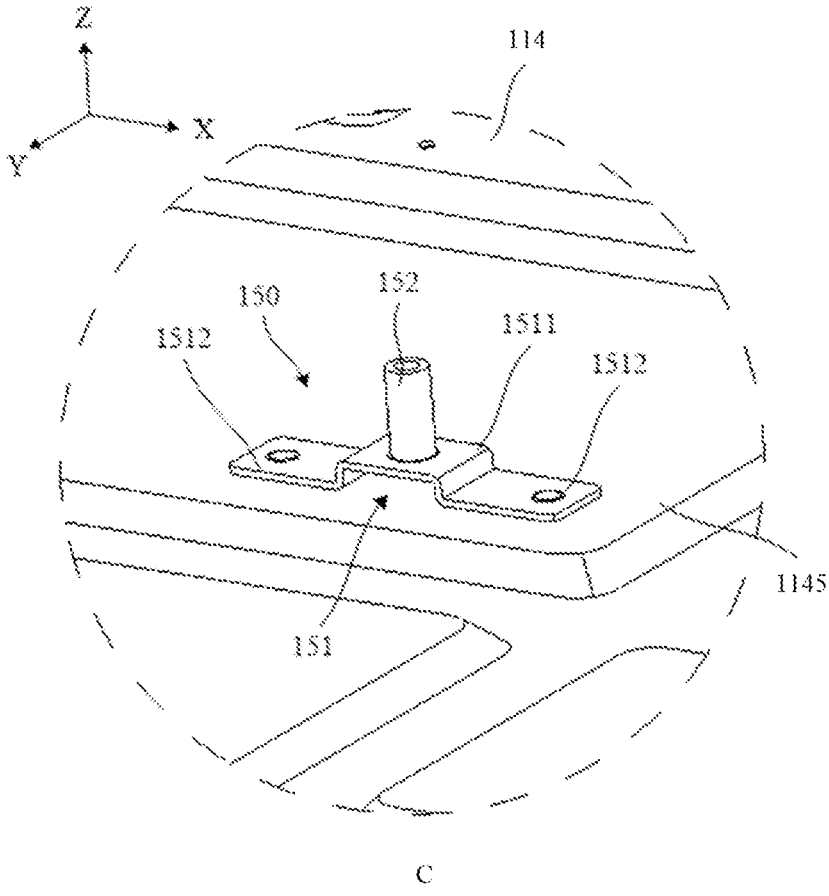
FIG. 15 is a partially enlarged view of area C of in FIG. 14.
Figure 16:
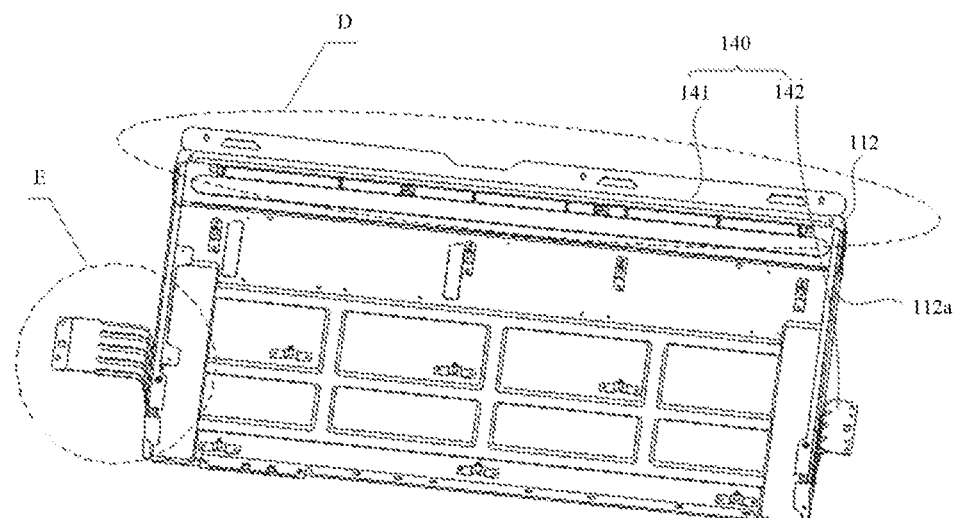
FIG. 16 is a schematic diagram of a partial structure of a box body in an electric control box according to an embodiment of the present application.
Figure 17:
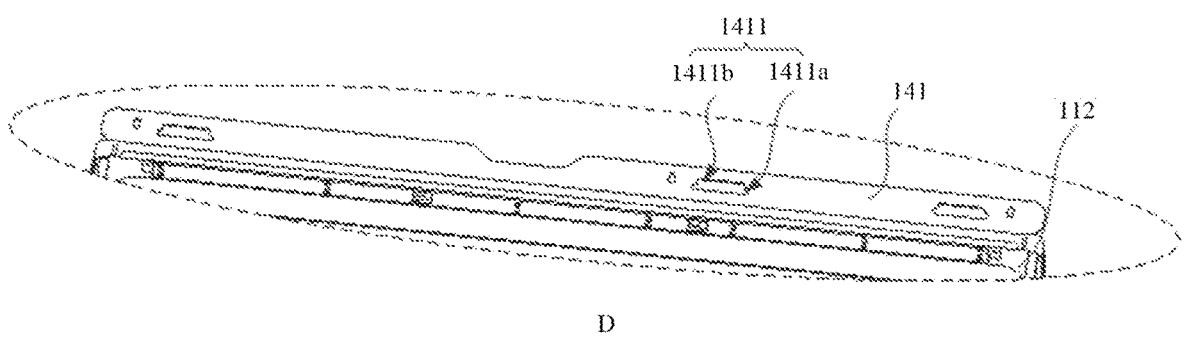
FIG. 17 is a partially enlarged view of area D of in FIG. 16.
Figure 18:
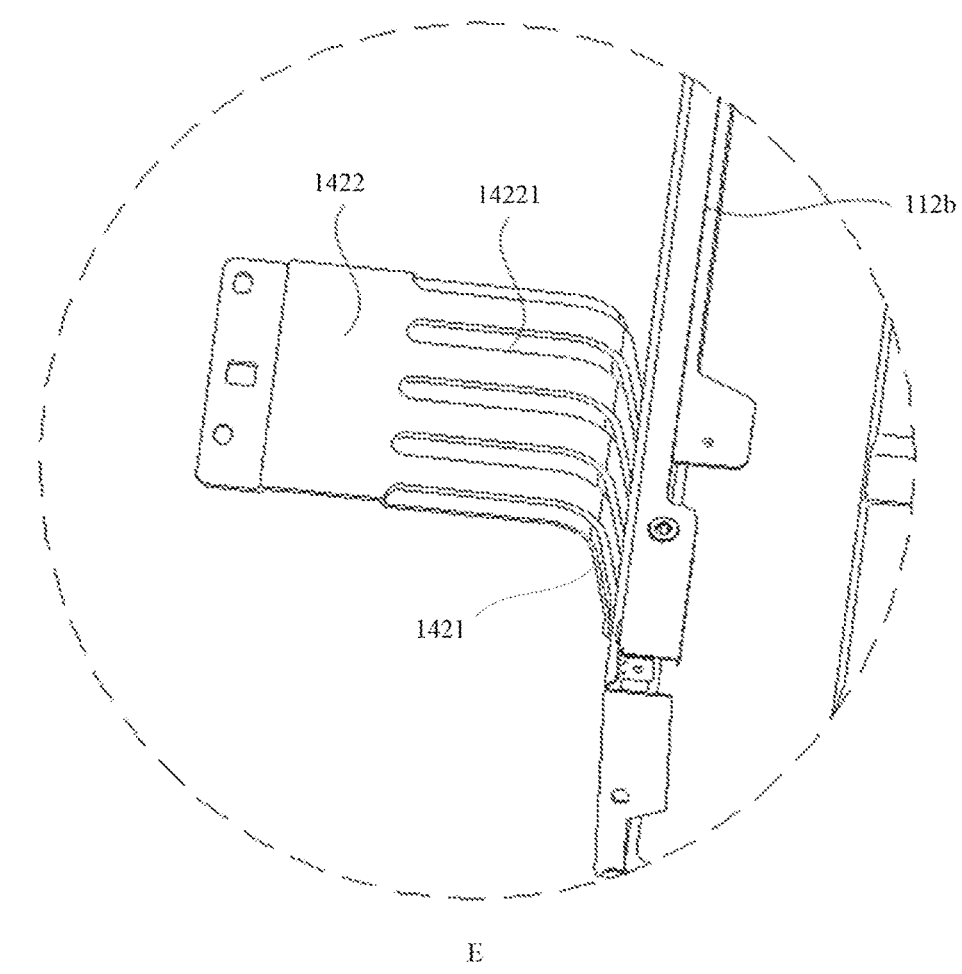
FIG. 18 is a partially enlarged view of area E of in FIG. 16.
Figure 19:
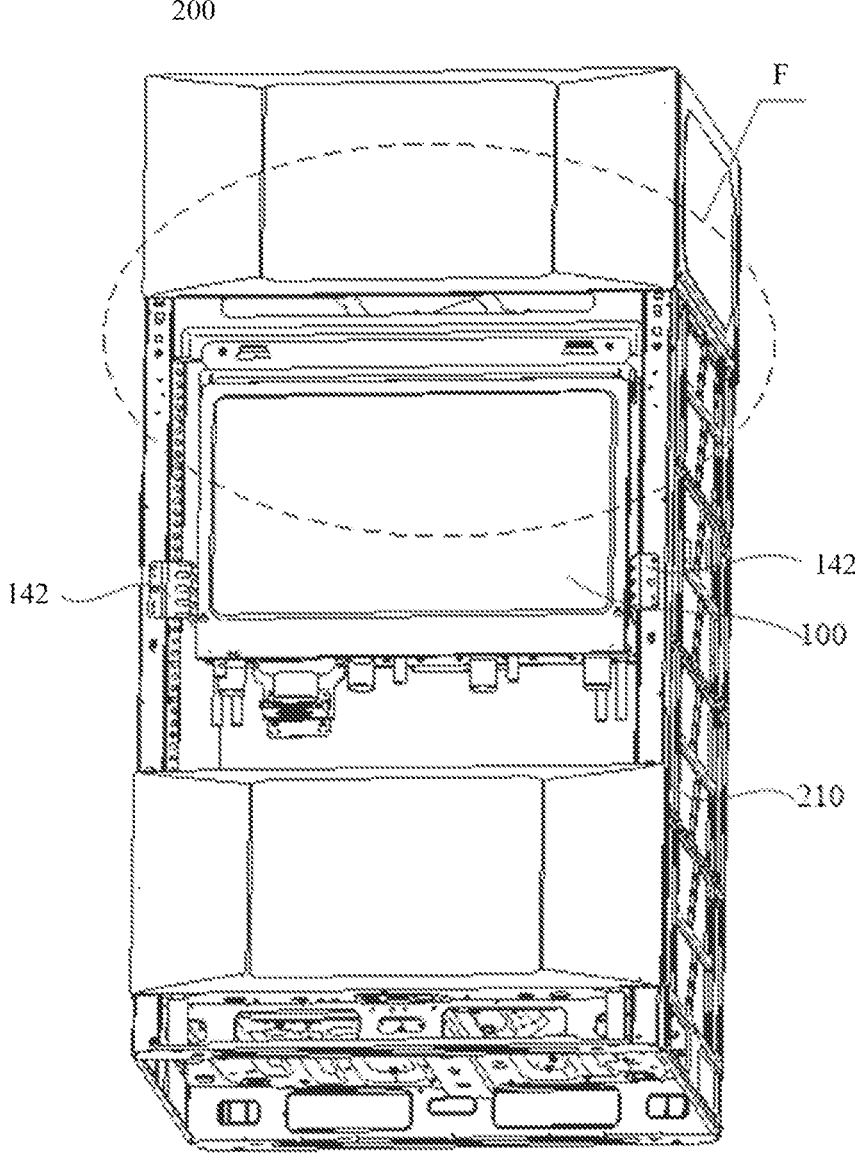
FIG. 19 is a structural schematic diagram in which an electric control box is assembled to an air conditioning outdoor unit according to an embodiment of the present application.
Figure 20:
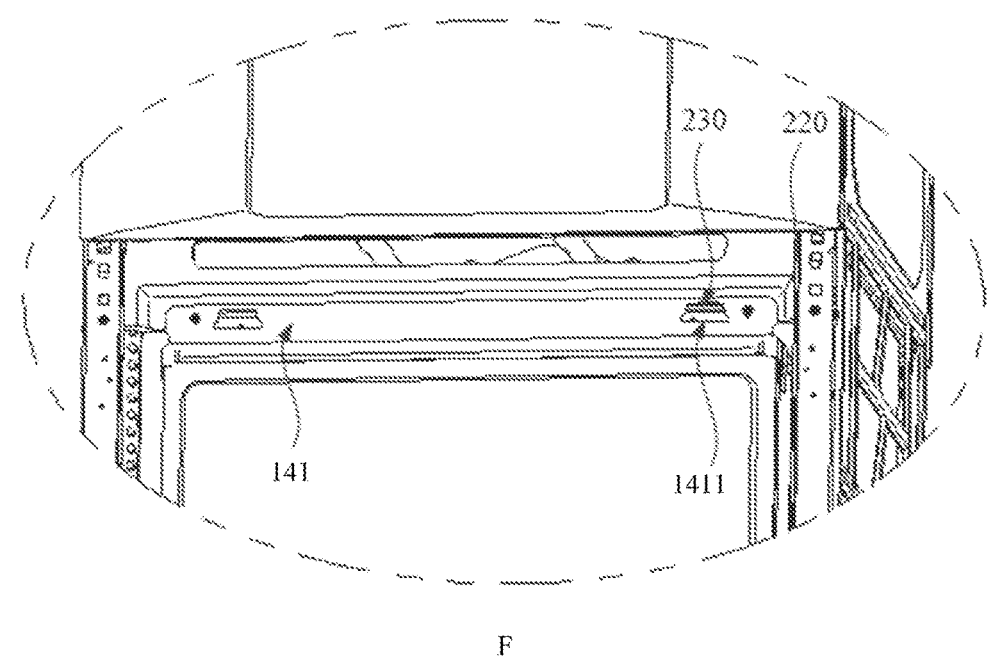
FIG. 20 is a partial enlarged view of area F in FIG. 19.

Referring to FIGS. 1 to 4 in combination with FIGS. 14 and 15, the mounting plate fixing member 150 may be provided in the holding chamber 115 and configured to fix the mounting plate 120 to the bottom plate 114.

It should be understood that, the above embodiments illustrate a case in which devices such as a circuit board are provided in the electric control box 100. However, the embodiments of the present application are not limited thereto. In practice, the heat exchanger 130 and other devices can also be provided in the electric control box 100 according to needs, in this case, the heat exchanger 130 may also be provided on the mounting plate 120.

The structure of each part in the electric control box 100 will be described in detail below with reference to the accompanying drawings.

The mounting plate fixing member 150 includes a supporting base 151 and a connecting column 152, the supporting base 151 is connected to the bottom plate 114, the connecting column 152 is connected to a top end of the supporting base 151, and the mounting plate 120 can be connected to the connecting column 152, this is equivalent to that the mounting plate 120 is supported and fixed to the bottom plate 114 through the connecting column 152 and the supporting base 151.

In addition, a projection of the supporting base 151 onto the bottom plate 114 covers a projection of the connecting post 152 onto the bottom plate 114, in other words, the size of the contour of the supporting base 151 in a horizontal direction is larger than the size of the contour of the connecting column 152 in the horizontal direction. Compared to using a connecting column alone to support the mounting plate 120 to the bottom plate 114 in existing technologies, this actually increases arrangement scope of support points on the bottom plate 114 for the mounting plate fixing member 150, which not only makes the connection between the bottom plate 114 and the mounting plate fixing member 150 less prone to failure, but also improves the supportability of the mounting plate fixing member 150 to the mounting plate 120, resulting in better resistibility of the electronic control box 100 to dropping.

More specifically, points on the bottom plate 114 that are in contact with the mounting plate fixing member 150 serve supporting function, and each point may be referred to as a supporting point. In solutions in which the mounting plate 120 is supported only by a connecting column in existing technologies, points on the bottom plate 114 that are in contact with the bottom of the connecting column 152 are supporting points, and the arrangement scope of the supporting points is limited within the scope of the bottom end face of the connecting column 152. However, in the present application, the connecting column 152 is supported on the supporting base 151, the supporting base 151 is supported on the bottom plate 114, all the points on the bottom plate 114 that are in contact with the supporting base 151 are supporting points, and the arrangement scope of the supporting points can be distributed within the scope of the bottom end face of the supporting base 151. The projection of the supporting base 151 onto the bottom plate 114 covers the projection of the connecting post 152 onto the bottom plate 114, and the arrangement scope of the supporting points on the bottom plate 114 for supporting the supporting base 151 is greater than the arrangement scope of the supporting points on the bottom plate 114 for separately supporting the connecting column 152, so that the supporting performance of the mounting plate fixing member 150 for the mounting plate 120 is better.

The situation in which the projection of the supporting base 151 onto the bottom plate 114 covers the projection of the connecting post 152 onto the bottom plate 114 mentioned in the above solution not only refers to that the area of the projection of the supporting base 151 onto the bottom plate 114 is greater than the area of the projection of the connecting column 152 onto the bottom plate 114, but also requires the projection of the connecting column 152 onto the bottom plate 114 to be within the scope of the projection of the supporting base 151 onto the bottom plate 114. In this way, the center of gravity of the connecting column 152 is within the supporting scope of the supporting base 151, resulting in a better supporting effect of the mounting plate fixing member 150 on the mounting plate 120. Of course, multiple mounting plate fixing members 150 may be provided to support the mounting plate more firmly.

The connecting column 152 may be connected to the top end of the supporting base 151 by welding, and the mounting plate 120 may be installed to the connecting column 152 by threaded connection. For example, an internal threaded hole can be provided in the connecting column 152, so that a fastener, such as a screw, penetrates through the mounting plate 120 and is screwed into the internal threaded hole, thereby achieving the connection between the mounting plate 120 and the connecting column 152.

The supporting base 151 may include a main body part 1511 and two mounting parts 1512 connected to two opposite sides of the main body 1511, respectively. In this way, the provision of the two mounting parts 1512 on two opposite sides of the main body 1511 can make the projection scope of the supporting base 151 on the bottom plate 114 larger, thereby expanding the arrangement scope of supporting points on the bottom plate 114 for supporting the supporting base 151. Therefore, the mounting parts 1512 and the main body part 1511 can have a better supporting effect on the mounting plate 120.

In the above-described solution, the mounting parts 1512 may be connected to the bottom plate 114, and a gap is provided between the main body part 1511 and the bottom plate 114, and the connecting column 152 can be fixed to the main body part 1511.

It can be understood that, because the main body part 1511 is suspended under the supporting of the two mounting parts 1512, when the electric control box 100 is impacted or dropped, the mounting plate 120 presses the connecting column 152 to move together towards the bottom plate 114, the main body part 1511 can be forced to move towards the bottom plate 114 to cause deformation of the supporting base 151, this deformation will buffer partial impact force applied to the electric control box 100, thereby preventing the mounting plate fixing member 150 and the bottom plate 114 from being separated from each other, and further improving the reliability of the assembling of the mounting plate 120.

Here, the supporting base 151 can be made of a metal material with better toughness, for example, the supporting base 151 can be connected to the bottom plate 114 by welding. Alternatively, as shown in FIG. 15, each of the two mounting parts 1512 can be provided with a mounting hole, and each mounting part 1512 can be fixed to the bottom plate 114 by threading a fastener through the mounting hole and fixing the fastener to the bottom plate 114.

Of course, regardless of whether the mounting parts 1512 are connected to the bottom plate 114 by welding or fasteners, it can be considered to make the bottoms of the two mounting parts 1512 attach to the bottom plate 114. For example, bottom end faces of the two mounting parts 1512 attach to a top end face of the bottom plate 114, therefore, there is a larger contact area between the supporting base 151 and the bottom plate 114 when the mounting parts 1512 are supported on the bottom plate 114.

In embodiments of the present application, in a same supporting base 151 including the two mounting parts 1512 and the connecting column 152, the two mounting parts 1512 can be symmetrically provided relative to the connecting column 152. In this way, the forces to which the two mounting parts 1512 are subjected are relatively uniform, which provides better support for the main body part 1511, and at the same time makes the connection between the two mounting parts 1512 and the bottom plate 114 less prone to failure.

In embodiments of the present application, the material of the box body 112 is generally metal, and the box body 112 can be a sheet metal part, and its components such as the bottom plate 114 due to large area thereof are easy to deform under the action of impact force when the electronic control box is impacted or dropped. At this time, in order to improve the strength of the bottom plate 114 and prevent its deformation, it can be considered that an inner surface of the bottom plate 114 is provided with multiple convex blocks 1147 protruding towards an inner side of the holding chamber. The convex blocks 1147 can be formed by stamping the sheet metal part forming the bottom plate 114 towards the inner side of the holding chamber or the convex blocks 1147 are solid blocks provided on the bottom plate 114. At this time, at least some mounting plate fixing members 150 can be provided on the convex blocks 1147 to enhance the deformation ability of the mounting plate fixing member 150 when the electronic control box 100 is impacted.

As mentioned above, the electronic control box 100 can include the heat exchanger 130 provided on the mounting plate 120, for example, the heat exchanger 130 can be provided at a bottom side of the mounting plate 120, and a circuit board can be provided at a top side of the mounting plate 120, and the heat exchanger 130 can be located between the bottom plate 114 and the mounting plate 120 when the mounting plate 120 is assembled to the bottom plate 114 through the mounting plate fixing member 150.

Here, the heat exchanger 130 can include, for example, multiple heat exchange pipes 131 provided at intervals, a refrigerant is housed in the heat exchange pipes 131, and the heat exchanger 130 can rely on the circulating flow of the refrigerant in the heat exchange pipes 131 to achieve heat dissipation.

Here, in order to avoid interference with the heat exchanger 130, multiple mounting plate fixing members 150 can be located at gaps between multiple heat exchange pipes 131, that is, each mounting plate fixing member 150 passes through a gap existing in the heat exchanger 130 and is connected to the mounting plate 120. In this way, the heat exchanger 130 is actually located within the space defined by the bottom plate 114, the mounting plate fixing members 150, and the mounting plate 120, and at this time, the provision of the heat exchanger 130 does not cause an increase in the thickness of the electronic control box.

In order to circulate the refrigerant in the heat exchanger 130, the heat exchanger 130 also includes the input pipe 134 and the output pipe 135. The input pipe 134 and output pipe 135 can be located on both sides of the heat exchange pipe 131, respectively, and both the input pipe 134 and output pipe 135 are communicated with the heat exchange pipe 131.

It should be noted that since the diameters of the input pipe 134 and the output pipe 135 are slightly larger than that of the heat exchange pipe 131, an avoidance groove 1146 dented towards an outer side of the holding chamber can be provided on a position of the bottom plate 114 opposite to each of the input pipe 134 and the output pipe 135. For example, the avoidance groove 1146 may be located at an edge position on each of the opposite sides of the bottom plate 114, and the length direction of the avoidance groove 1146 can be in accordance with the width direction (X-axis direction) of the electric control box 100, that is, the avoidance groove 1146 can extend along the width direction of the electric control box 100.

Referring to FIGS. 16 to 20 in combination with FIGS. 1 to 4, the box body 112 is provided with a connecting assembly 140, and the connecting assembly 140 includes a hanging plate 141 and at least two connecting members 142. The hanging plate 141 and the connecting members 142 jointly support the electric control box 100. The hanging plate 141 is configured to limit the displacement of the electric control box 100 in a vertical direction, so as to prevent the electric control box 100 from moving or shaking in the vertical direction. The at least two connecting members 142 are configured to respectively limit the displacement of the electric control box 100 in a first direction and a second direction, the first direction is opposite to the second direction, and both the first direction and the second direction are perpendicular to the vertical direction, so as to prevent the electric control box 100 from moving or shaking in the first and second directions, this can improve the shaking phenomenon of the electric control box during the operation of the air conditioning outdoor unit, thereby improving the reliability of the connection between the electric control box and the air conditioning outdoor unit.

For example, in a horizontal plane perpendicular to the vertical direction, the first direction can be a positive direction along the X axis, and the second direction can be a reverse direction along the X axis; alternatively, the first direction can be a positive direction along the Y-axis, and the second direction can be a reverse direction along the Y-axis; as long as the electronic control box 100 can be limited in different directions within the horizontal plane, this embodiment does not make specific restrictions on this.

It can be understood that the hanging plate 141 limits and fixes the electric control box 100 in the vertical direction; the at least two connecting members 142 limit and fix the electric control box 100 in the first and second directions respectively, so as to limit and fix the electric control box 100 in the three different directions and avoid shaking of the electric control box 100, thereby improving the reliability of the connection between the electric control box and the air conditioning outdoor unit.

In some embodiments, the at least two connecting members 142 include a first connecting member and a second connecting member, the first connecting member is configured to limit the displacement of the electric control box 100 in the first direction so as to limit and fix the electric control box 100 in the first direction, and the second connecting member is configured to limit the displacement of the electric control box 100 in the second direction so as to limit and fix the electric control box 100 in the second direction.

The first connecting member and the second connecting member are respectively provided at two opposite sides of the box body 112. In this way, both sides of the electric control box 100 are fixedly connected to the air conditioning outdoor unit when the air conditioning outdoor unit is operating, this can improve the phenomenon of the electric control box 100 shaking together with the air conditioning outdoor unit when the air conditioning outdoor unit is operating, thereby improving the reliability of the connection between the electric control box 100 and the air conditioning outdoor unit.

The first connecting member can be one or more, and when the first connecting member is multiple, the multiple first connecting members can be arranged at intervals on a same side of the box body; the second connecting member can also be one or more, and when the second connecting member is multiple, the multiple second connecting members can be arranged at intervals on a same side of the box body.

When the first and second connecting members are multiple, the multiple first connecting members and the multiple second connecting members can improve the reliability of the connection between the electric control box 100 and the air conditioning outdoor unit.

The hanging plate 141 is provided with a hanging hole 1411 for hanging the electric control box 100, and the hanging plate 141 limits the displacement of the electric control box 100 in the vertical direction through the hanging hole.

It can be understood that a supporting structure of the air conditioning outdoor unit for supporting the electric control box 100 can be provided with a hook and other structures, for example, the supporting structure is provided with a hook, and the hook can be inserted into the hanging hole to limit the displacement of the hanging plate 141 in the vertical direction, so that the hanging plate 141 can be hung on the supporting structure of the air conditioning outdoor unit through the hanging hole 1411.

In addition, the hanging plate 141 is also provided with a connecting hole, and the supporting structure of the air conditioning outdoor unit is provided with a threaded hole. After the hanging plate 141 is hung on the supporting structure of the air conditioning outdoor unit through the hanging hole 1411, the hanging plate 141 is fixed with the supporting structure through a fastener, so as to improve the reliability of the connection between the hanging plate 141 and the supporting structure.

Both the hanging plate 141 and the connecting members 142 can be sheet metal parts, for example, the hanging plate 141 and the connecting members 142 can be made of 45 steel, alloy steel or other metal materials suitable for sheet metal bending.

The hanging plate 141 may be located at the top of the box body 112, and the hanging plate 141 is hung on the supporting structure of the air conditioning outdoor unit through the hanging hole 1411 in the hanging plate 141.

For example, a lower end of the hanging plate 141 is connected to an edge of a top wall of the box body 112, and an upper end of the hanging plate 141 extends in a direction away from the box body 112.

It can be understood that, the lower end of the hanging plate 141 is connected to the edge of the top wall of the box body 112, which means that the lower end of the hanging plate 141 can be in welded connection, or fastener connection (such as screw connection, bolt connection, rivet connection, etc.) with the edge of the top wall of the box body 112, or the lower end of the hanging plate 141 can be integrated with the edge of the top wall of the box body 112.

Alternatively, the hanging plate 141 can be integrated with a side wall of the box body 112.

It can be understood that, the hanging plate 141 and the side wall of the box body 112 are integrally formed by casting or injection molding, so that the hanging plate 141 and the side wall of the box body 112 are formed as an integrated part, so as to simplify the assembling process between the hanging plate 141 and the box body 112, thereby reducing the assembling cost.

When the hanging plate 141 and the side wall of the box body 112 are formed as an integrated part, in an optional embodiment, one end of the hanging plate 141 extends towards the top wall of the box body 112 and extends beyond the top wall of the box body 112, and the hanging hole 1411 is provided in a portion of the hanging plate 141 facing the top wall of the box body 112. In another optional embodiment, the hanging plate 141 coincides with the side wall of the box body 112, and the hanging hole 1411 is located in the side wall of the box body 112, for example, the hanging hole 1411 can be located in a position of the side wall of the box body 112 near the top wall of the box body 112.

The hanging hole 1411 includes an extension part 1411*a* and a suspension part 1411*b*, the suspension portion 1411*b* is located above the extension part 1411*a*.

For example, when the hanging plate 141 needs to be hung on the supporting structure of the air conditioning outdoor unit, the hook on the supporting structure can insert into the hanging hole 1411 through the extension part 1411*a* firstly, then the hook enter the suspension part 1411*b* and is connected to the suspension part 1411*b* under the natural gravity of the electric control box 100, so that the hanging plate 141 is hung on the hook.

In order to facilitate the hook to enter the suspension hole 1411, in embodiments of this application, the hole diameter of the extension part 1411*a* is greater than that of the suspension part 1411*b*. In this way, when the hanging plate 141 is hung on the hook through the suspension hole 1411, the hook enters the extension part 1411*a* having a larger hole diameter firstly, and then enters the suspension part 1411*b* having a smaller hole diameter under the natural gravity of the electric control box 100. When the hook needs to be removed from the suspension hole 1411, the electric control box 100 can be moved upward as a whole to make the hook enter into the extension part 1411*a*, and then the hook can be removed from the extension part 1411*a*. In this way, it is convenient for the hook to enter or remove from the suspension hole 1411, and can prevent the hook from detaching from the suspension hole 1411 when the hanging plate 141 is hung on the air conditioning outdoor unit, thereby improving the reliability of the connection between the hanging plate 141 and the air conditioning outdoor unit.

For example, the cross-sectional shape of the hanging hole 1411 formed by the extension part 1411*a* and the suspension part 1411*b* can be one of a trapezoid shape, a cucurbit shape, and an inverted T-shape; alternatively the cross-sectional shape of the hanging hole 1411 formed by the extension part 1411*a* and the suspension part 1411*b* can also be other shapes, as long as it is convenient for the hook to enter or remove from the suspension hole 1411 while improving the reliability of the connection between the hook and the suspension hole 1411. This embodiment does not impose specific limitations on this.

In addition, the hanging hole 1411 can be multiple, for example, the hanging hole 1411 can be two, three, or four. Multiple hanging holes 1411 are provided at intervals in the hanging plate 141 along a same horizontal straight line. By providing multiple hanging holes 1411, the reliability of the connection between the electric control box 100 and the supporting structure can be improved.

In order to further improve the reliability of the connection between the electric control box 100 and the air conditioning outdoor unit, the connecting members 142 are located on side walls of the box body 112 away from the hanging plate 141, so as to prevent connection points between the electric control box 100 and the air conditioning outdoor unit from being concentrated in a local position, thereby improving the stability of the connection between the electric control box 100 and the air conditioning outdoor unit.

Each connecting member 142 includes a connecting part 1421 and a bending part 1422, one end of the bending part 1422 is connected to the connecting part 1421, and the other end of the bending part 1422 extends towards a side away from the box body 112, the connecting part 1421 is connected to the box body 112, and the bending part 1422 is configured to be connected to the supporting structure of the air conditioner.

It can be understood that, the connecting member 142 is a sheet metal part, and the connecting member 142 can form the connecting part 1421 and the bending part 1422 connected to the connecting part 1421 through bending and other processes. In addition, the size of the connecting part 1421 along the extension direction can be determined according to the corresponding connection position on the air conditioning outdoor unit, and the size of the bending part 1422 along the extension direction can also be determined according to the corresponding connection position on the air conditioning outdoor unit, this embodiment does not impose specific limitations.

In addition, the connecting part 1421 can be connected to the box body 112 of the electronic control box 100 by welding, bonding, fastener connection, etc. to fix the connecting part 1421 to the box body 112.

On the basis of the above embodiments, the bending part 1422 is provided with a reinforcing rib 14221, and the strength of the connecting member 142 can be improved by the reinforcing rib 14221, so as to prevent the phenomenon of the breaking of the connecting member 142 due to the shaking of the electric control box 100 relative to the air conditioning outdoor unit, thereby improving the reliability of the connection between the electric control box 100 and the air conditioning outdoor unit.

It can be understood that the reinforcing rib 14221 can be a protrusion formed on the bending part 1422. Alternatively, the reinforcing rib 14221 can be a concave groove formed on the bending part 1422 by denting the bending part 1422 towards a lower surface of the bending part 1422, and a protrusion protruding away from the bending part 1422 is formed on the lower surface of the bending part 1422 at the position corresponding to the groove, that is, the reinforcing rib 14221 is a pressed rib formed on the bending part 1422 through a pressing process.

The reinforcing rib 14221 may be multiple, and multiple reinforcing ribs 14221 are provided on the bending part 1422 at intervals along a direction perpendicular to the extension direction of the bending part 1422 to improve the strength of the connecting member 142.

The reinforcing rib 14221 is a groove formed by denting the upper surface of the bending part 1422 towards the lower surface of the bending part 1422, and there are multiple grooves, the multiple grooves are provided on the bending part 1422 at intervals along a direction perpendicular to the extension direction of the bending part 1422, and the formation process is simple and the cost is low.

Figure 21:
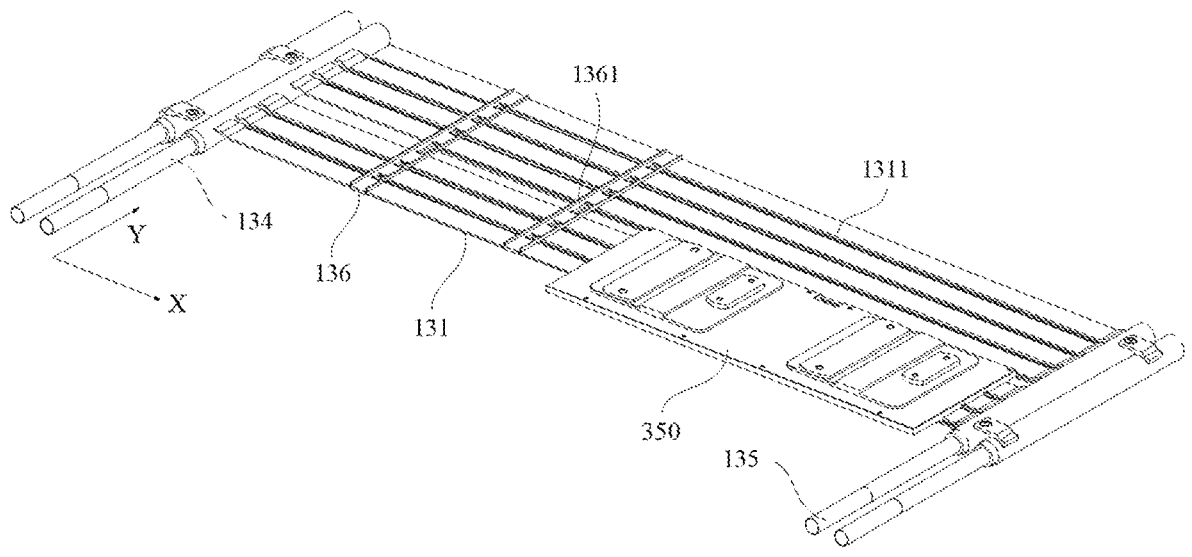
FIG. 21 is a structural schematic diagram of a heat exchanger according to an embodiment of the present application.
Figure 22:
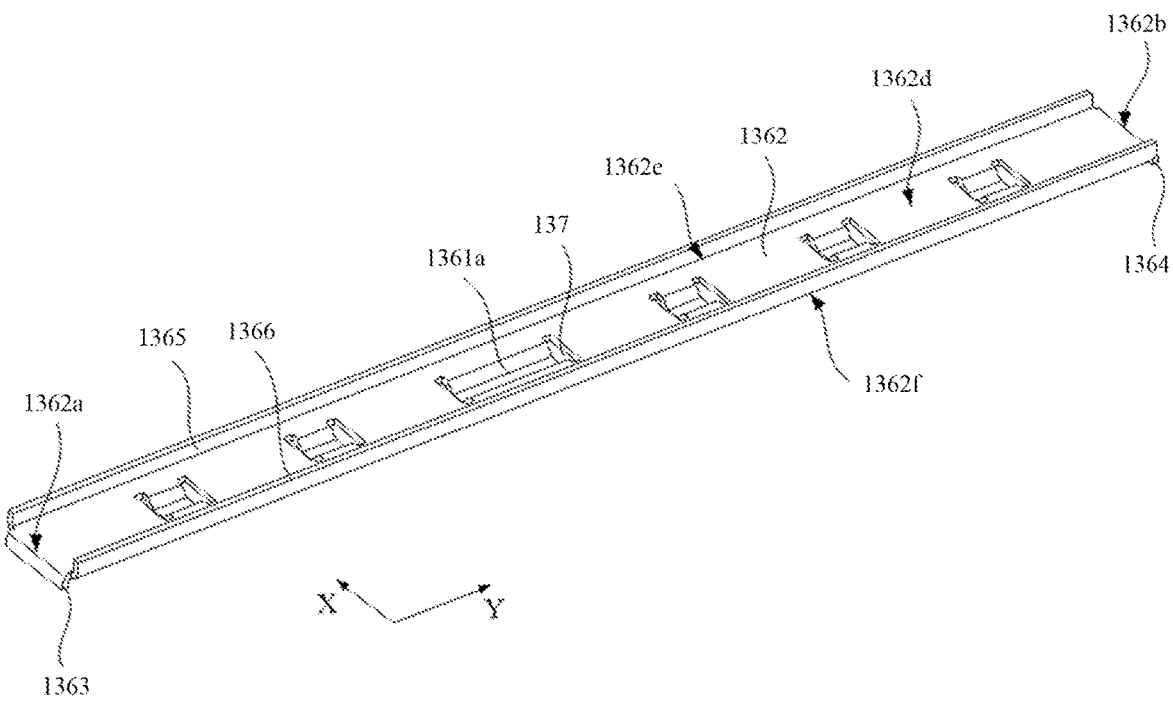
FIG. 22 is a structural schematic diagram of a reinforcing plate of a heat exchanger in one direction according to an embodiment of the present application.
Figure 23:
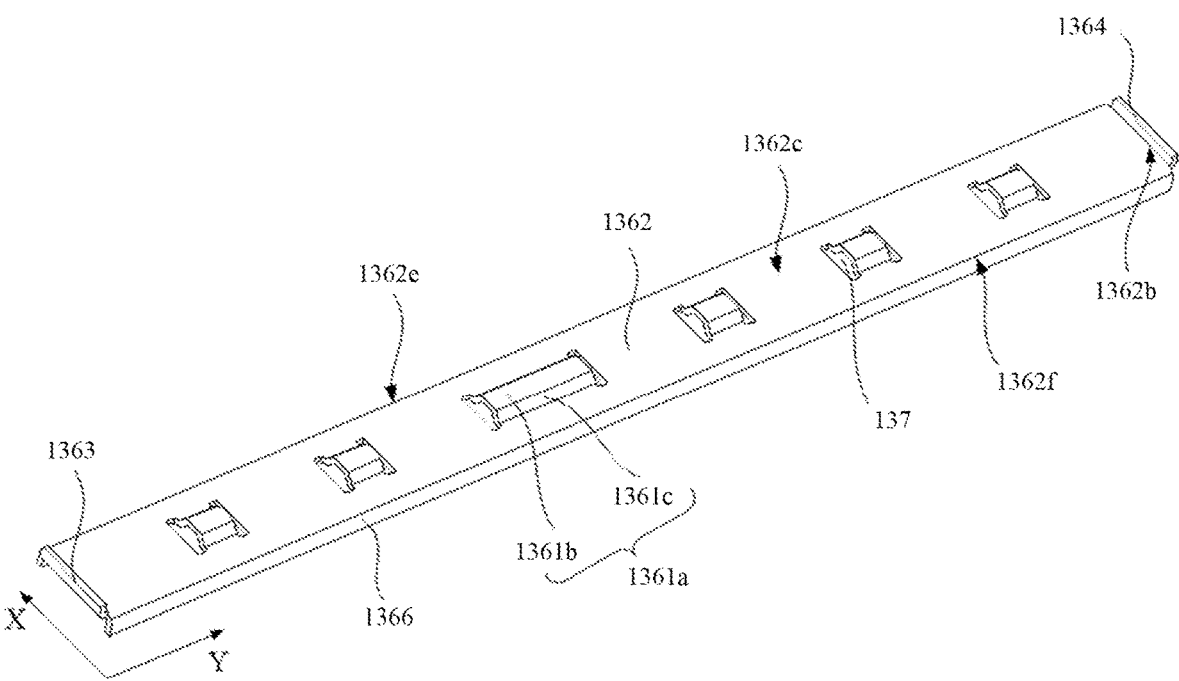
FIG. 23 is a structural schematic diagram of a reinforcing plate of a heat exchanger in another direction according to an embodiment of the present application.

Referring to FIGS. 21 to 23 in combination with FIGS. 1 to 4, an electric control box in this embodiment includes a heat exchanger 130, a fan assembly, and a box body 112 having a holding chamber 115, and the fan assembly is located inside the holding chamber 115. The fan assembly is used to form airflow, the heat exchanger 130 is at least partially provided inside the box body 112, and the heat exchanger 130 is used to exchange heat with the airflow formed by the fan assembly.

The holding chamber 115 can be an enclosed space, and the entire heat exchanger 130 is located inside the box body 112, at this time, the fan assembly drives the air inside the box body 112 to form airflow, and the heat exchanger 130 is used to exchange heat with the air circulating inside the box body 112.

The electric control box in this embodiment also includes a mounting plate 120, and the mounting plate 120 provides a position for mounting an electrical device inside the electric control box. The mounting plate 120 has a first mounting face and a second mounting face that are opposite to each other, and the first mounting face faces a bottom plate 114 of the box body 112 and the second mounting face faces a box cover 111 of the box body 112. The heat exchanger 130 is fixed on the first mounting face, and the fan assembly is fixed on the second mounting face.

The mounting plate 120 may be a rectangular plate which is fixed in the box body 112 and separates the holding chamber 115 in the box body 112 into a first chamber 1151 and a second chamber 1152. The first chamber 1151 is used to accommodate the heat exchanger 130; the second chamber 1152 is used to accommodate electrical devices, such as a fan assembly, an electric reactor, an electronic control board, etc.

The fan assembly, used as a component for forming airflow, can blow the air in the second chamber 1152 to the heat exchanger 130 in the first chamber 1151 for heat exchange, and blow the heat-exchanged air back to the second chamber 1152 to achieve air flow and heat exchange inside the box body 112, which may be beneficial for improving the cleanliness of the air inside the box body 112.

In order to achieve the flow of air at both sides of the mounting plate 120, a portion of the mounting plate 120 in this embodiment is constructed as a ventilation grid 127, and the first chamber 1151 and the second chamber 1152 are communicated through the ventilation grid 127. Moreover, an air inlet of the fan assembly is located in the first chamber 1151, and an air outlet of the fan assembly is located in the second chamber 1152. In this way, the fan assembly absorbs heat-exchanged air having a lower temperature in the first chamber 1151 through the air inlet of the fan assembly, and discharges the air to the second chamber 1152 through the air outlet of the fan assembly, and also drives air having a higher temperature in the second chamber 1152 to return to the first chamber 1151 through the ventilation grid 127, so as to contact and exchange heat with the heat exchanger 130. In this cycle, the heat generated by electrical devices in the second chamber 1152 is exchanged with the heat exchanger 130, thereby achieving the heat dissipation.

In order to prolong a flow distance of the air in the second chamber 1152 and improve heat dissipation effect, there is a second preset gap between the ventilation grid 127 and the fan assembly. For example, in combination with FIG. 1, the fan assembly is disposed at a left rear end of the mounting plate 120, and the ventilation grid 127 is formed at a front end of the mounting plate 120 by processing of the mounting plate 120.

The fan assembly in this embodiment can include a mounting pipe and a fan disposed inside the mounting pipe. Both two ends of the mounting pipe extend into the first chamber 1151 and the second chamber 1152 respectively, and the fan rotates to drive air to flow.

In some embodiments, the fan assembly is provided to drive air to the heat exchanger 130 for heat exchange, which can accelerate the flow of air and improve heat dissipation effect.

The heat exchanger 130 in this embodiment serves as a heat dissipation structure of the electric control box, which may include multiple heat exchange pipes 131 and at least one reinforcing plate 136.

The heat exchange pipes 131 are used for the circulation of a heat exchange medium. Each heat exchange pipe 131 may be a circular pipe, a rectangular pipe, or the like. According to FIG. 2, the heat exchange pipe 131 in this embodiment may be a flat pipe, and a cross section of the heat exchange pipe 131 may be, but is not limited to, a rectangle, a circle, an ellipse, a parallelogram, or the like. These shapes are only used for illustration, and the cross-sectional shape of the heat exchange pipe 131 is not limited in the present application. The heat exchange pipe 131 has a first surface 1311 and a second surface opposite to each other, so that a larger heat exchange area can be provided, thereby improving the heat dissipation effect.

The heat exchanger 130 in this embodiment further includes an input pipe 134 and an output pipe 135. A first end of each of the multiple heat exchange pipes 131 is communicated with the input pipe 134, and a second end of each of the multiple heat exchange pipes 131 is communicated with the output pipe 135, in this way, a heat exchange medium enters the heat exchange pipes 131 from the input pipe 134, and then is discharged through the output pipe 135. The input pipe 134 may be communicated with an outlet of an economizer, so that the heat exchange medium in the economizer enters the heat exchange pipes 131 through the input pipe 134; the output pipe 135 is communicated with an inlet of the economizer to discharge the heat-exchanged heat exchange medium back into the economizer through the output pipe 135.

The input pipe 134 and the output pipe 135 extend along a length direction (corresponding to a Y direction in the figures) perpendicular to the heat exchange pipes 131, and thus may be communicated with all the heat exchange pipes 131. For example, two input pipes 134 are provided, and two output pipes 135 are provided, so that the flow rate of the heat exchange medium is improved, thereby improving the heat dissipation effect. Of course, the number of the input pipe 134 and the number of the output pipe 135 are not limited thereto.

All the heat exchange pipes 131 extend along an X direction in the figures, the multiple heat exchange pipes 131 are arranged at intervals along a direction (corresponding to a Y direction in the figures) perpendicular to the length direction of the heat exchange pipes 131, and there is a gap between two adjacent heat exchange pipes 131. The multiple heat exchange pipes 131 are arranged at intervals in a uniform manner along a direction (corresponding to a Y direction in the figures) perpendicular to the length direction of the heat exchange pipes 131, and at this time, each distance between two adjacent heat exchange pipes 131 is the same. Alternatively, a distance between at least two adjacent heat exchange pipes 131 is different from distances between other adjacent heat exchange pipes 131. Taking FIG. 2 as an example, seven heat exchange pipes 131 are provided at intervals along the length direction of the input pipe 134, and the distance between the third and the fourth heat exchange pipes 131 that are determined in a direction from front to back is greater than distances between other adjacent heat exchange pipes 131, so as to avoid structures in the box body 112. The distance between two adjacent heat exchange pipes 131 is not limited in embodiments of the present application.

In some embodiments, a surface of a reinforced plate 136 is provided with multiple position-limiting protrusions 1361, and the position-limiting protrusions 1361 are matched with gaps between the multiple heat exchange pipes 131, the multiple position-limiting protrusions are stuck in the gaps between the multiple heat exchange pipes, respectively, so as to limit the positions of the multiple heat exchange pipes 131 spaced along a direction perpendicular to the length direction of the heat exchange pipes 131, to ensure the presence of the gaps between the heat exchange pipes 131. Therefore, air can pass through the gaps to improve heat exchange efficiency, thereby improving heat dissipation effect.

The position-limiting protrusions 1361 may also play a role in increasing the structural strength of the reinforcing plate 136, so as to avoid deformation of the heat exchange pipes 131 caused by the deformation of the reinforcing plate 136. In addition, because the position-limiting protrusions 1361 are matched with the gaps between the heat exchange pipes 131, the limiting protrusions 1361 will not affect the overall size of the heat exchanger 130, thereby maintaining the compactness of the structure of the heat exchanger 130.

The reinforcing plate 136 may include a plate body 1362 and the position-limiting protrusions 1361 provided on the plate body 1362. In some embodiments, the reinforcing plate 136, in addition to being stuck in the gaps between the multiple heat exchange pipes 131 through the position-limiting protrusions 1361, its plate body 1362 can also be fixedly connected to the heat exchange pipes 131.

The plate body 1362 of the reinforcing plate 136 in embodiments of the present application may be fixedly connected to all the heat exchange pipes 131, that is, both ends of the plate body 1362 are at least aligned with the two outermost heat exchange pipes 131. In this way, the structural strength of all the heat exchange pipes 131 can be improved, and the bending deformation can be avoided.

The plate body 1362 is fixedly connected to the heat exchange pipes 131 in various manners. For example, a locking structure may be provided on each of the heat exchange pipes 131, and the locking structure is locked to the plate body 1362, so that the reinforcing plate 136 is fixed to the heat exchange pipes 131. For example, the plate body 1362 is welded to the heat exchanging pipes 131, and the connection is stable and reliable.

The plate body 1362 may be a flat and straight plate, and the plate body 1362 can also be a curved flat plate to avoid some structures on the mounting plate 120. When the plate body 1362 is a flat and straight plate, the plate body 1362 may extend in multiple directions, for example, as shown in FIG. 2, the plate body 1362 is perpendicular to the heat exchange pipes 131, at this time, the reinforcing plate 136 extends along a direction (corresponding to a Y direction in the figures) perpendicular to the length direction of the heat exchange pipes 131. In this way, the plate body 1362 relatively short, which can be fixedly connected to all the heat exchange pipes 131 and can also prevent the heat exchange pipes 131 from being excessively shielded to affect the heat dissipation effect. For another example, the plate body 1362 may also be provided in an inclined manner relative to the length direction (corresponding to a X direction in the figures) of the heat exchange pipes 131, and at this time, the angle between the plate body 1362 and each of the heat exchange pipes 131 is an acute angle.

The plate body 1362 may be a square plate, so that the plate body 1362 and the heat exchange pipes 131 have a larger connection area, thereby improving the structural strength of the heat exchange pipes 131. The plate body 1362 may be a rectangular plate, and the plate body 1362 is strip-shaped, and the length of the plate body 1362 along the width direction (corresponding to the Y direction in the figures) of the heat exchange pipes 131 is greater than the length of the plate body 1362 along the length direction (corresponding to the X direction in the figures) of the heat exchange pipes 131. The plate body 1362 can be fixedly connected to all the heat exchange pipes 131, and can also reduce area of shielding the heat exchange pipes 131, thereby ensuring the surface area of the heat exchange pipes 131 for heat exchange.

For the heat exchanger 130 in some embodiments, since the reinforcing plate 136 is provided on the heat exchange pipes 131, the structural strength of the heat exchange pipes 131 is improved, thereby preventing the multiple heat exchange pipes from being overlapped after the heat exchange pipes 131 are bent and deformed or displaced, therefore, this ensure that the heat exchange medium in the heat exchange pipes 131 can flow smoothly and has a maximum heat exchange area. By the providing of the position-limiting protrusions 1361 on the surface of the reinforcing plate 136 and making the position-limiting protrusions 1361 stuck in the gaps between the multiple heat exchange pipes 131, two adjacent heat exchange pipes 131 are prevented from contacting or overlapping, thereby ensuring the presence of a gap between adjacent two heat exchange pipes 131. By this arrangement, when the fan assembly drives the air inside the box body 112 to circulate, the air can pass through the gap between two adjacent heat exchange pipes 131 and fully contact and exchange heat with the surface of the heat exchange pipes 131 in which the heat exchange medium flows, thereby improving heat exchange efficiency and improving heat dissipation effect.

In some possible implementations, the position-limiting protrusion 1361 includes a position-limiting block provided on a surface of the plate body 1362 of the reinforcing plate 136, the position-limiting block may be a rectangular block, a cylindrical block, or the like. When the position-limiting block is a rectangular block, the position-limiting block may contact with heat exchange pipes 131 at both sides of the position-limiting block, so as to limit the positions of the heat exchange pipes 131 and prevent the heat exchange pipes 131 from bending and deforming towards the gap.

The position-limiting protrusion 1361 includes a position-limiting convex hull 1361*a* formed by denting the reinforcing plate 136 towards the heat exchange pipes 131. For example, the position-limiting convex hull 1361*a* is formed by a stamping process which is simple and efficient. Moreover, compared to the position-limiting block, the position-limiting convex hull 1361*a* has a light weight, which may be beneficial for reducing the weight of the heat exchanger 130.

Each of both sides of the position-limiting convex hull 1361*a* is provided with a second opening 137, and the second opening 137 extends along the length direction (corresponding to the X direction in the figures) of the heat exchange pipes 131, and two second openings 137 are arranged at intervals along the Y direction in the figures. Two end faces of the position-limiting convex hull 1361*a* facing its second openings 137 respectively abut against heat exchange pipes 131 at both sides of the position-limiting convex hull 1361*a*, which can improve the positional accuracy of the intervals of the heat exchange pipes 131 in a direction perpendicular to the length direction (corresponding to the Y direction in the figures) of the heat exchange pipes 131, and prevent the heat exchange pipes 131 from moving in the direction (corresponding to the Y direction in the figures) perpendicular to the length direction of the heat exchange pipes 131.

In some embodiments, the provision of second openings 137 can limit positions where stamping is performed, so as to avoid the difficulty in assembly caused by deviations during the stamping process. During the process of forming the position-limiting convex hull 1361*a* by stamping in a situation in which each second opening 137 is provided, two each of the end faces facing the second opening 137 is more neat and have no burrs, thereby preventing the burrs from damaging the heat exchange pipes 131 in the assembling process and improving the reliability of the production process of the heat exchanger 130. Moreover, the provision of the second opening 137 may also make air pass through the heat exchanger 130 through each second opening 137, which may be beneficial for improving the heat dissipation effect. In addition, the contact area between one end face and one heat exchange pipe 131 is small, so as to avoid shielding the heat exchange area of the heat exchange pipe 131.

The position-limiting convex hull 1361*a* can be circular-arc-shaped, triangular-shaped, U-shaped, etc., the position-limiting convex hull 1361*a* may include a large circular-arc-shaped protrusion, and the position-limiting convex hull 1361*a* can also include multiple small circular arcs. The specific shape of the position-limiting convex hull 1361*a* is not limited in the embodiments of the present application.

In one possible embodiment, the position-limiting convex hull 1361*a* includes a bottom wall 1361*b* and two side walls 1361*c*, the two side walls 1361*c* are provided at intervals at two sides of the bottom wall 1361*b*, and the two side walls 1361*c* are respectively connected to the reinforcing plate 136, thus forming a U-shaped position-limiting convex hull 1361*a*. An end face formed by the two side walls 1361*c* and the bottom wall 1361*b* forms a second opening 137 along the length direction (corresponding to the X direction in the figures) of the heat exchange pipe 131. A transition arc is provided at a connection position between the side wall 1361*c* and the reinforcing plate 136 to prevent a tip from scratching the heat exchange pipe 131 during assembling.

The height of the position-limiting convex hull 1361*a* is greater than or equal to the thickness of the heat exchange pipe 131, this arrangement helps to ensure the reliability of the fitting between the heat exchange pipe 131 and the reinforcing plate 136, and to prevent the position-limiting convex hull 1361*a* from being too small to limit heat exchange pipes 131 on both sides of the position-limiting convex hull 1361*a*.

In some embodiments, multiple position-limiting protrusion groups are provided along a direction (corresponding to a Y direction in the figures) perpendicular to the length direction of each heat exchange pipe 131, and at least one heat exchange pipe 131 is clamped between two adjacent position-limiting protrusion groups. One heat exchange pipe 131 is clamped between two adjacent position-limiting protrusion groups, that is, at least one position-limiting protrusion group is provided between two adjacent heat exchange pipes 131. Multiple heat exchange pipes 131 are clamped between two adjacent position-limiting protrusion groups, for example, two or three heat exchange pipes 131 are clamped between two adjacent position-limiting protrusion groups.

One position-limiting protrusion group includes one position-limiting protrusion 1361, resulting in easy processing. Alternatively, one position-limiting protrusion group includes multiple position-limiting protrusions 1361, and the multiple position-limiting protrusions 1361 are provided at intervals along the length direction (corresponding to the X direction in the figures) of each heat exchange pipe 131. This configuration may be beneficial for improving the position-limiting effect on each heat exchange pipe 131, the structural strength of each heat exchange pipe 131, and avoiding bending deformation.

The plate body 1362 of the reinforcing plate 136 is a cube, for example, a cuboid. The plate body 1362 includes a first face 1362c and a second face 1362d that are opposite to each other, and a first edge 1362a and a second edge 1362b that are opposite to each other. The first face 1362c and the second face 1362d are both parallel to the surface of each heat exchange pipe 131. The first face 1362c and the second face 1362d extend along a direction (corresponding to a Y direction in the figures) perpendicular to the length direction of each heat exchange pipe 131. The above-mentioned position-limiting protrusion 1361 protrudes from the first face 1362c. The first edge 1362a is connected to one ends of the first face 1362c and the second face 1362d respectively, the second edge 1362b is connected to the other ends of the first face 1362c and the second face 1362d respectively, and the first edge 1362a and the second edge 1362b are located at front and rear ends of the first face 1362c respectively. In the orientation shown in FIG. 3, the first face 1362c is a bottom face, the second face 1362d is a top face, the first edge 1362a is a front end face, and the second edge 1362b is a back end face.

The reinforcing plate 136 further includes a first position-limiting flange 1363 that bent and extended from the first edge 1362a towards the direction of the first face 1362c, and a first position-limiting flange 1364 bent and extended from the second edge 1362b in a direction towards the first face 1362c. The first position-limiting flange 1363 is opposite to the first position-limiting flange 1364.

Multiple heat exchange pipes 131 are clamped between the first position-limiting flanges 1363 and the first position-limiting flange 1364, and the two outermost heat exchange pipes 131 among the multiple heat exchange pipes 131 are in contact with the first position- limiting flange 1363 and the first position-limiting flange 1364 respectively, thereby limiting the outermost heat exchange pipes 131. Of course, the first position-limiting flange 1363 and the first position-limiting flange 1364 may also serve to improve the structural strength of the reinforcing plate 136, thereby preventing the heat exchange pipe 131 from being bent and deformed due to the deformation of the reinforcing plate 136 itself.

The plate body 1362 in this embodiment further includes a third edge 1362e and a fourth edge 1362f that are opposite to each other. The third edge 1362e is connected to one ends of the first face 1362c, the second face 1362d, the first edge 1362a, and the second edge 1362b respectively, and the fourth edge 1362f is connected to the other ends of the first face 1362c, the second face 1362d, the first edge 1362a, and the second edge 1362b respectively. In the orientation shown in FIG. 3, the third edge 1362e is a left side face, and the fourth edge 1362f is a right side face. The first edge 1362a, the third edge 1362e, the second edge 1362b, and the fourth edge 1362f enclose to form a quadrangle.

The reinforcing plate 136 in this embodiment further includes a first reinforced flange 1365 bent and extended from the third edge 1362e towards a direction away from the first face 1362c of the plate body 1362, and a second reinforced flange 1366 bent and extended from the fourth edge 1362f towards a direction away from the first face 1362c of the plate body 1362 and facing the direction of the second face 1362d. That is, the third edge 1362e is bent and extended towards the direction of the second face 1362d to form the first reinforced flange 1365, and the fourth edge 1362f is bent and extended towards the direction of the second face 1362d to form the second reinforced flange 1366. The second reinforced flange 1366 and the first reinforced flange 1365 are spaced and opposite to each other. With this arrangement, the strength of the reinforcing plate 136 is improved, so that the reinforcing plate 136 is not easy to deform in the length direction thereof, this is conducive to improving the flatness of the heat exchanger 130 during assembly and transportation processes.

Each heat exchange pipe 131 has a first surface 1311 and the second surface that are opposite to each other, and the reinforcing plate 136 can be fixed on the first surface 1311, while the reinforcing plate 136 can also be fixed on the second surface. Of course, the first surface 1311 and the second surface can also be fixed with the reinforcing plate 136 at the same time.

The first surface 1311 can be provided with one reinforcing plate 136, and the heat exchanger 130 has a simple structure and is convenient for assembly. The first surface 1311 may also be provided with multiple reinforcing plates 136, and the multiple reinforcing plates 136 are provided at intervals on the first surface 1311 along the length direction (corresponding to the X direction in the figures) of each heat exchange pipe 131, thereby further improving the structural strength of the heat exchange pipe 131 and preventing the heat exchange pipe 131 from being bent.

The second surface 1311 can be provided with one reinforcing plate 136, and the heat exchanger 130 has a simple structure and is convenient for assembly. The second surface 1311 may also be provided with multiple reinforcing plates 136, and the multiple reinforcing plates 136 are provided at intervals on the second surface 1311 along the length direction (corresponding to the X direction in the figures) of each heat exchange pipe 131, thereby further improving the structural strength of the heat exchange pipe 131 and preventing the heat exchange pipe 131 from being bended.

The heat exchanger 130 in this embodiment further includes a heat dissipation plate 133, the heat dissipation plate 133 is fixed on the heat exchange pipe 131, and there is a first preset distance between the heat dissipation plate 133 and the reinforcing plate 136.

The heat dissipation plate 133 may be clamped to the heat exchange pipe 131 through a clamping structure, and the heat dissipation plate 133 may also be welded to the heat exchange pipe 131, which leads to easy, stable, and reliable assembling, and can ensure that the heat dissipation plate 133 is in contact with the heat exchange pipe 131, thereby improving the heat transfer efficiency. A thermally conductive adhesive layer may also be provided between the heat dissipating plate 133 and the heat exchanging pipe 131, thereby further improving the heat transfer efficiency.

When the mounting plate 120 is provided with a mounting hole, in some embodiments, the heat dissipation plate 133 is provided to be exposed to the mounting hole and is directly fixedly connected to an electrical device, allowing the electrical device to dissipate heat through the flow of air and to directly contact the heat dissipation plate 133 for dissipating heat, thereby improving the heat dissipation effect. In addition, the heat dissipation plate 133 may also serve to reinforce the heat exchange pipe 131 and prevent the heat exchange pipe 131 from being bent and deformed.

The heat dissipation plate 133 is fixedly connected to a first mounting face of the mounting plate 120, for example, the heat dissipation plate 133 is fixedly connected to the mounting plate 120 through screws, and the connection method is simple and reliable.

The thickness of the heat dissipation plate 133 in this embodiment is greater than the size of the reinforcing plate 136 along the thickness direction of the heat dissipation plate 133, which can make the reinforcing plate 136 lower than the heat dissipation plate 133, so that the heat dissipation plate 133 can be fully connected to the mounting plate 120, avoiding gaps between them to affect heat transfer.

It should be noted here that when the reinforcing plate 136 is provided with the first reinforced flange 1365, the dimension of the reinforcing plate 136 along the thickness direction of the heat dissipation plate 133 includes the height of the first reinforced flange 1365.

Continuing to refer to FIGS. 16 to 20, an embodiment in the present application also provides an air conditioning outdoor unit 200, the air conditioning outdoor unit 200 includes the electric control box 100 described in the above first embodiment. The air conditioning outdoor unit 200 includes a machine body 210, the machine body 210 has a holding chamber, and a supporting structure 220 such as a support beam is provided in the holding chamber, the supporting structure can be provided with a hook 230, and a top wall of the electric control box 100 is provided with a hanging plate 141, and the hanging plate 141 is provided with a hanging hole, the two opposite side walls of the electric control box 100 are provided with connecting members 142, respectively. The electric control box 100 is hung on the hook 230 through the hanging hole in the hanging plate 141, and the hanging plate 141 is connected to the support structure 220 through a fastener. The two opposite side walls of the electric control box 100 are connected to the machine body 210 of the air conditioning outdoor unit 200 through the connecting members 142 respectively. The machine body 210 can be provided with threaded holes, and the connecting members 142 and hanging plate 141 can be connected to the threaded holes in the machine body 210 through fasteners, in this way, the problem that the electric control box 100 is shaking relative to the air-conditioning outdoor unit 200 when the air-conditioning outdoor unit 200 operates can be improved, thereby improving the reliability of the connection between the electric control box 100 and the air conditioning outdoor unit 200.

An air conditioner is also provided in embodiments of this application, which includes an air conditioning indoor unit and an air conditioning outdoor unit described in the second embodiment.

The air conditioner provided in embodiments of this application can be a central air conditioner, where the central air conditioner includes an air conditioning indoor unit and an air conditioning outdoor unit. The air conditioning outdoor unit is usually disposed outdoors, and the air conditioning indoor unit is usually disposed indoors, the air conditioning indoor unit and the air conditioning outdoor unit work together to achieve cooling, heating, dehumidification, and air purification of the air conditioner, in order to achieve comfortable air quality.

In the central air conditioner, there is usually one air conditioning outdoor unit, while there may be a plurality of air conditioning indoor units, every air conditioning indoor unit is provided with one or more air outlets to discharge the cooled, heated, dehumidified, or purified air through the air outlets into the room.

The air conditioning indoor unit may be provided with an indoor heat exchanger, while the air conditioning outdoor unit may be provided with an outdoor heat exchanger, the indoor heat exchanger and the outdoor heat exchanger are usually communicated through a refrigerant pipe, allowing a refrigerant between the indoor heat exchanger and the outdoor heat exchanger to be circulated.

During a cooling process of the central air conditioner, the indoor heat exchanger of the air conditioner is an evaporator, and a refrigerant in the evaporator absorbs heat from the liquid to change to a gaseous state. During the process of evaporating and absorbing heat of the refrigerant, the evaporator exchanges heat with air flowing through the evaporator to take away heat from air in the air conditioning indoor unit, resulting in that the air discharged from the air conditioning indoor unit is air that has subjected to heat releasing and cooling, and the air conditioning indoor unit blows cold air. At the same time, the outdoor heat exchanger is a condenser, a refrigerant in the condenser changes from a gaseous state to a liquid state. During the process of condensing and releasing heat of the refrigerant, the condenser exchanges heat with the air flowing through the condenser in the air conditioning outdoor unit, so that the air in the air conditioning outdoor unit brings heat of the condenser to the outside of the air conditioning outdoor unit, thus achieving the cooling process.

During a heating process of the air conditioner, the outdoor heat exchanger is an evaporator, and a refrigerant in the evaporator absorbs heat from a liquid state to change into a gaseous state. During the process of evaporating and absorbing heat of the refrigerant, the evaporator exchanges heat with air flowing through the evaporator, so as to replace heat carried in the air in the air conditioning outdoor unit with the refrigerant in the evaporator. At the same time, the indoor heat exchanger is a condenser, a refrigerant in the condenser changes from a gaseous state to a liquid state. During the process of condensing and releasing heat of the refrigerant, the condenser exchanges heat with the air flowing through the condenser in the air conditioning indoor unit, so that the air in the air conditioning indoor unit takes away the heat carried by the condenser and discharges it from the air conditioning indoor unit to the outside of the air conditioning indoor unit, allowing the air conditioning indoor unit to blow hot air, thus achieving the heating process.

The heat exchanger in the embodiments of this application can be a microchannel heat exchanger. The microchannel heat exchanger includes at least two sets of microchannels. The at least two sets of microchannels include multiple first microchannels for a first refrigerant flow to flow and multiple second microchannels for a second refrigerant flow to flow. The second refrigerant flow absorbs heat from the first refrigerant flow to make the first refrigerant flow cold, or the first refrigerant flow absorbs heat from the second refrigerant flow to make the second refrigerant flow cold.

The microchannel heat exchanger in the embodiments of this application may also serve as an economizer for an air conditioner. In this way, the microchannel heat exchanger can be used not only to cool electronic devices inside an electronic control box, and can also be used as an economizer, thereby avoiding the need to dispose another economizer outside the electronic control box, simplifying the structure of the air conditioner, saving space, and also saving costs.

The above electric control box is disposed inside an air conditioning outdoor unit, and can be used to control the working process of a compressor in the air conditioning outdoor unit.

Figure 24:
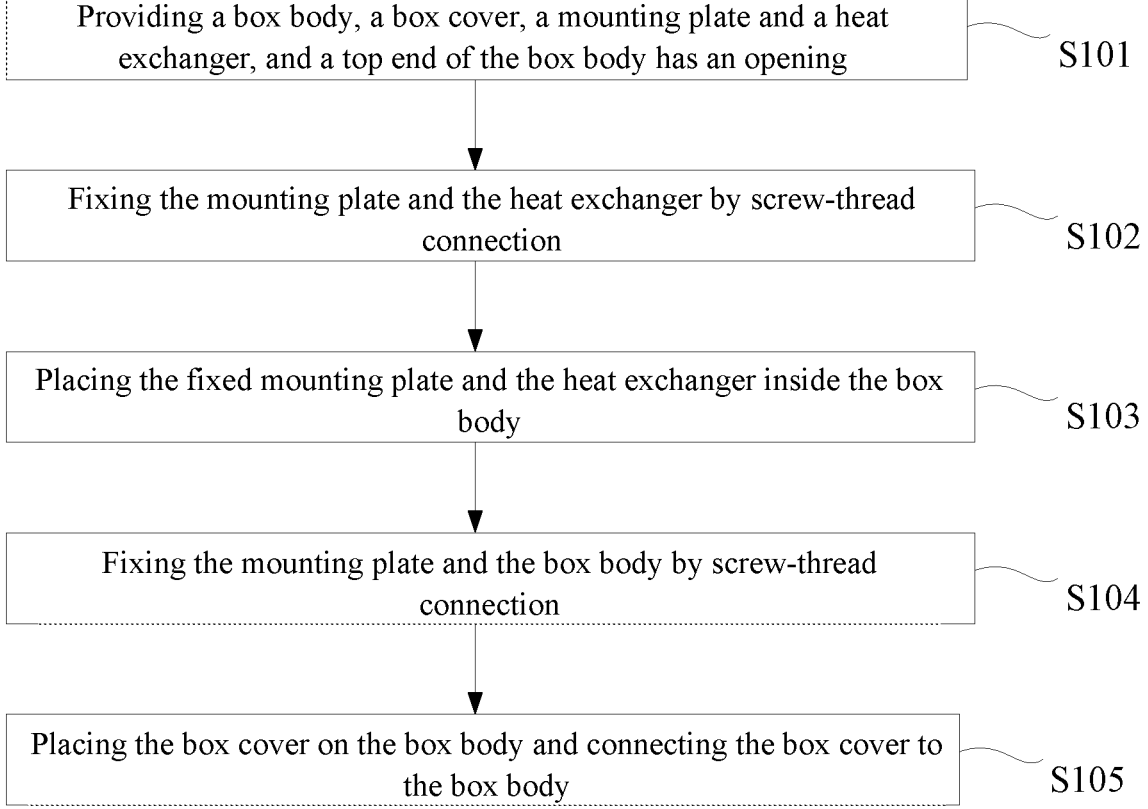
FIG. 24 is a schematic flow chart of a method for assembling an electric control box according to an embodiment of the present application.

On the basis of the above embodiments, as shown in FIG. 24, a method for assembling an electric control box 100 is also provided in an embodiment of the present application. In some embodiments, the method for assembling the electric control box 100 can include the following steps.

S101: a Box Body 112, a Box Cover 111, a Mounting Plate 120, and a Heat Exchanger 130 are Provided, and a Top End of the Box Body 112 has an Opening (a first Opening 115a).

Figure 1:
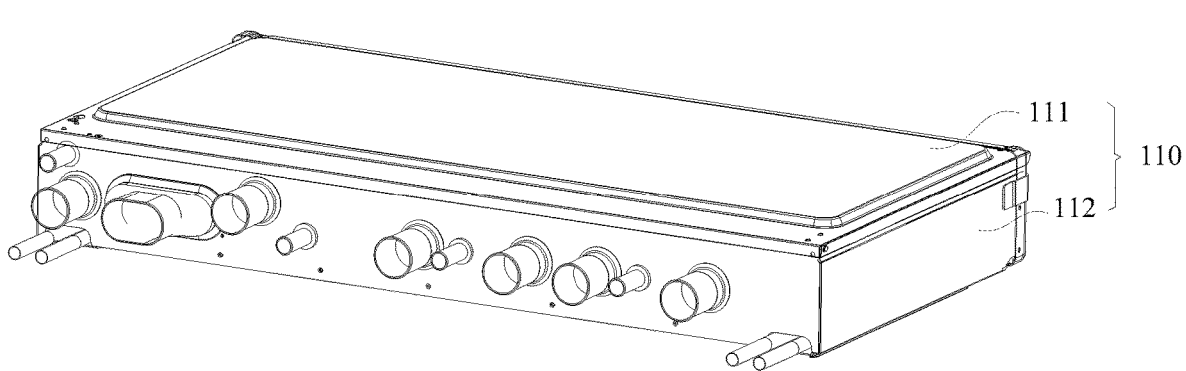
FIG. 1 is a schematic diagram of a three-dimensional structure of an electronic control box according to an embodiment of the present application.

As shown in FIG. 1, a shell 110 composed of the box cover 111 and the box body 112 is provided. After the shell 110 is assembled, the shell 110 can be an enclosed shell. For example, the inside and outside of the shell 110 are isolated, and liquids and dusts cannot enter the inside of the shell 110, allowing the electric control box 100 can achieve the performances of water resistance and dust prevention. Therefore, the electronic control box 100 is able to work normally even in harsh outdoor environments, the reliability of the electronic control box 100 is improved and its service life is extended.

As shown in FIG. 2, the top end of the box body 112 provided in an embodiment of the present application has a first opening 115a, for example, the top end of the box body 112 is open, and the box cover 111 is provided to cover the first opening 115a of the top end of the box body 112. The box body 112 can be a square box body 112, a circular box body 112, or a box body 112 of other shapes. In embodiments of the present application, the shape of the box body 112 includes but is not limited to, square, circle or ellipse. In embodiments of the present application, the box body 112 can be specifically described as a square box.

It can be understood that the box body 112 and the box cover 111 can be detachably connected, and before assembling, as shown in FIG. 3, the box cover 111 is detached from the box body 112, so that the first opening 115a at the top end of the box body 112 is opened.

As shown in FIG. 2, a mounting plate 120 is further provided, and the mounting plate 120 is specifically an electrical mounting plate, the electrical mounting plate may be provided with a connection base, a reactor, a filter and other electrical devices. In order to dissipate heat of electronic devices in the electric control box 100, a heat exchanger 130 is further provided, and the heat exchanger 130 may be a heat exchange pipe, one end of the heat exchange pipe is used as a refrigerant medium input pipe and the other end of the heat exchange pipe is used as a refrigerant medium output pipe, so as to achieve heat dissipation effect through a refrigerant medium.

S102: the mounting plate 120 and the heat exchanger 130 are fixed by threaded connection.

As shown in FIG. 5, the mounting plate 120 and the heat exchanger 130 can be two separated components. In actual assembling, as shown in FIG. 6, the mounting plate 120 and the heat exchanger 130 can be fixed, for example, the mounting plate 120 and the heat exchanger 130 can be connected by threaded connection. For example, two ends of the heat exchanger 130 can be provided with connecting members 132, respectively, and a first connecting hole 1321 can be provided in each connecting member 132. In addition, a second connecting hole 122 in the mounting plate 120 is provided corresponding to the first connecting hole 1321, a first fastener 121 passes through the second connecting hole 122 and is screwed into the first connecting hole 1321.

In this way, the mounting plate 120 and the heat exchanger 130 may be fixed to form an integral structure under the thread fit between the first fastener 121 and the first connecting hole 1321 as well as the second connecting hole 122.

In order to fix middle portions of the mounting plate 120 and the heat exchanger 130, the heat exchanger 130 can also be provided with a heat dissipation plate 133. The heat dissipation plate 133 can be provided with a first assembly hole, in addition, the mounting plate 120 can be provided with a second assembly hole, therefore, when the first assembly hole is opposite to the second assembly hole, the middle portions of the mounting plate 120 and the heat exchanger 130 are fixed by threaded connection of a threaded assembly component 124 and the first assembly hole as well as the second assembly hole. Therefore, both two ends and middle portions of the mounting plate 120 and the heat exchanger 130 are fixed, a more reliable connection between the heat exchanger 130 and the mounting plate 120 is achieved, thereby preventing components in the electric control box 100 from being displaced due to the loosening between the heat exchanger 130 and the mounting plate 120 or from being damaged due to collision during transportation process.

S103: the fixed mounting plate 120 and the heat exchanger 130 are placed inside the box body 112.

As shown in FIG. 7, an entire structure of the fixed heat exchanger 130 and the mounting plate 120 is placed inside the box body 112 from the first opening 115a on the top end of the box body 112.

It should be understood that, because an input pipe 134 and an output pipe 135 are provided at both ends of the heat exchanger 130, the input pipe 134 and the output pipe 135 will block the assembling when the fixed heat exchanger 130 and the mounting plate 120 are assembled downwards from the first opening 115a on the top end of the box body 112. Therefore, in embodiments of the present application, as shown in FIG. 4, one side of the box body 112 is provided with a side opening 115b, in this way, the side opening 115b may provide avoidance effect on the assembly of the input pipe 134 and output pipe 135.

In step S101 above, when the box body 112 is provided, the method can include:

Step a: providing a side plate (which may be a right side plate 112a, a left side plate 112b, and a rear side plate 112c), a bottom plate 114, and a packaging plate 113, and a first avoidance part 1131 and a second avoidance part 1132 are formed on the heat dissipation plate 133;

Step b: making the side plate surround a part of an edge of the bottom plate 114, so that a side opening 115b is formed on a side face of the box body 112;

Step c: assembling the package plate 113 to the side opening 115b, where the package plate 113, the side plate and the bottom plate 114 enclose to form a holding chamber 115 having an open top end.

In this way, the provided box body 112 may have the side opening 115b, and it can be understood that, before assembling, the packaging plate 113 can be removed from a position where the side opening 115b is located, so that the side opening 115b is opened.

In this way, when step S103 is performed, the fixed mounting plate 120 and the heat exchanger 130 are placed in the box body 112 from the first opening 115a of the box body 112, and the side opening 115b avoids the input pipe 134 of the heat exchanger 130 and the output pipe 135 of the heat exchanger 130. As shown in FIG. 7, the input pipe 134 of the heat exchanger 130 and the output pipe 135 of the heat exchanger 130 extend outward from the side opening 115b.

S104: the mounting plate 120 and the box body 112 are fixed by threaded connection.

As shown in FIG. 7, when the entire structure of the mounting plate 120 and the heat exchanger 130 is placed in the box body 112, a second fastener 125 is used to cooperate with the threaded hole (see FIG. 4) in the bottom plate 114 of the box body 112 to fix the mounting plate 120, a heat dissipation component, and the box body 112 in order to fix the overall structure with the box body 112. In this way, the entire structure of the mounting plate 120 and the heat dissipation component is fixed at a position inside the box 112, and the entire structure of the mounting plate 120 and the heat dissipation component is not prone to occur positional deviation within the box 112 that may cause poor contact of circuit during transportation or use.

S105: the box cover 111 covers the box body 112 and the box cover 111 is connected to the box body 112.

It can be understood that, in the above step S103, the assembling is performed after the packaging plate 113 is removed from the side opening 115b. Therefore, in embodiments of the present application, before the box cover 111 covers the box body 112, as shown in FIG. 8, the method further includes: arranging the packaging plate 113 at a position where the side opening 115b is located, and connecting the packaging plate 113 with the side plate, and the input pipe 134 of the heat exchanger 130 and the output pipe 135 of the heat exchanger 130 may pass through the first avoidance part 1131 and the second avoidance part 1132 respectively.

As shown in FIG. 9, the box cover 111 may cover the top ends of the side plate and the packaging plate 113, and the box cover 111 can be securely connected to the top ends of the packaging plate 113 and the side plate through screws. In this way, the assembly of the electric control box 100 is completed.

It should be noted that, in embodiments of the present application, the box cover 111 and the packaging plate 113 are mutually independent structures, and in one possible implementation, the box cover 111 and the packaging plate 113 may also be integrated as a whole structure. For example, the box cover 111 and the packaging plate 113 are formed as an integrated part, in this way, after Step S104, the integrated structure formed by the box cover 111 and the packaging plate 113 may be assembled on the box body 112 at once, thereby reducing one assembly process.

Alternatively, in some embodiments, the three side plates (the left side plate 112b, the right side plate 112a, and the rear side plate 112c) of the box body 112 and the box cover 111 may also be formed as an integrated structure, therefore, the box cover 111 and the box body 112 form the shell 110 having the side opening 115b, and the packaging plate 113 is detachably connected to the side opening 115b. Therefore, step S103 is executed as follows: the fixed mounting plate 120 and the heat exchanger 130 can be horizontally assembled into the shell 110 from the side opening 115b, finally, the package plate 113 is assembled to the side opening 115b to complete the assembly of the electric control box 100. It should be noted that, after the heat exchanger 130 and the mounting plate 120 are fixed into an integrated structure which is then assembled from the side opening 115b, the mounting plate 120 and the box body 112 usually cannot be fixed in the vertical direction because there is no first opening 115a in the top end of the shell 110. However, the mounting plate 120 and the heat exchanger 130 can be respectively fixed to the packaging plate 113 or the side plates in the horizontal direction.

It should be noted that, in FIG. 8, when the input pipe 134 and output pipe 135 of the heat exchanger 130 pass through the first avoidance part 1131 and the second avoidance part 1132, the input pipe 134 and output pipe 135 are respectively sealed with the first avoidance part 1131 and the second avoidance part 1132 in order to ensure the sealing performance of the electric control box 100. For example, a sealing member (for example, sealant) is provided between the input pipe 134 as well as the output pipe 135 and the first avoidance portion 1131 as well as the second avoidance portion 1132 respectively.

According to the assembly manner of the electric control box 100 provided in embodiments of the present application, the mounting plate 120 and the heat exchanger 130 are fixed, specifically, the mounting plate 120 and the heat exchanger 130 are fixed by threaded connection, so that the corresponding positions of the connecting holes of the mounting plate 120 and the heat exchanger 130 are changeless during assembling, thereby achieving automated assembly between the mounting plate 120 and the heat exchanger 130 and improving the assembly efficiency of the mounting plate 120 and the heat exchanger 130. In addition, the mounting plate 120 and the box body 112 are fixed, specifically, the mounting plate 120 and the box body 112 are fixed by threaded connection, therefore, since the corresponding positions of the threaded holes of the mounting plate 120 and the box body 112 are changeless, the automated assembly is achieved, thereby finally achieving automated assembly of the electric control box 100 and improving the assembly efficiency of the electric control box 100.

On the basis of the above embodiments, as shown in FIG. 25, a method for assembling an electric control box 100 is also provided in an embodiment of the present application. In some embodiments, the method for assembling the electric control box 100 can include the following steps.

S201: a Box Body 112, a Box Cover 111, a Mounting Plate 120 and a Heat Exchanger 130 are Provided, and a Top End of the Box Body 112 has an Opening (a First Opening 115a).

This step can refer to step S101 in the above embodiment, and details will not be repeatedly described in this embodiment of the present application.

S202: the heat exchanger 130 is placed inside the box body 112.

It can be understood that the difference from step S102 in the above embodiment is that, in S202, the heat exchanger 130 is firstly assembled inside the box body 112. The heat exchanger 130 can be placed inside the box body 112 from the first opening 115a on the top end of the box body 112. During assembling, it can be understood that, due to an input pipe 134 and an output pipe 135 are provided at both ends of heat exchanger 130, the input pipe 134 and the output pipe 135 will block the assembling when the fixed heat exchanger 130 and the mounting plate 120 are assembled downwards from the first opening 115a on the top end of the box body 112. Therefore, in embodiments of the present application, as shown in FIG. 4, one side of the box body 112 is provided with a side opening 115b, in this way, the side opening 115b may provide avoidance effect on the assembly of the input pipe 134 and output pipe 135.

In step S101 above, when the box body 112 is provided, the method can include:

Step a: providing a side plate, a bottom plate 114, and a packaging plate 113, and a first avoidance part 1131 and a second avoidance part 1132 are formed on the heat dissipation plate 133;

Step b: making the side plate surround a part of an edge of the bottom plate 114, so that a side opening 115*b* is formed on a side of the box body 112;

Step c: assembling the package plate 113 to the side opening 115*b*, where the package plate 113, the side plate and the bottom plate 114 enclose to form a holding chamber 115 having an open top end.

In this way, the provided box body 112 may have the side opening 115*b*, and it can be understood that, before assembling, the packaging plate 113 can be removed from a position where the side opening 115*b* is located, so that the side opening 115*b* is opened.

In this way, when step S102 is performed, the heat exchanger 130 can be placed downwards from the first opening 115*a* on the top end of the box 112 and the side opening 115*b*, so that it can be placed inside the box 112, and the side opening 115*b* avoids the input pipe 134 of the heat exchanger 130 and the output pipe 135 of the heat exchanger 130, so that the input pipe 134 and output pipe 135 on the heat exchanger 130 can extend outward from the side opening 115*b* (see FIG. 7).

S203: the mounting plate 120 is installed inside the box body 112 and is located above the heat exchanger 130.

It can be understood that the mounting plate 120 is placed into the box body 112 from the first opening 115*a* on the top end of the box body 112. Since the heat exchanger 130 is installed inside the box body 112 firstly, the mounting plate 120 is located above the heat exchanger 130 after the mounting plate 120 is installed inside the box body 112.

S204: the mounting plate 120 and the heat exchanger 130 are fixed by threaded connection.

In step S102 above, the heat exchanger 130 and the mounting plate 120 are fixed before they are placed into the box body 112, while in the step S204, the mounting plate 120 and the heat exchanger 130 that have been placed in the box 112 are fixed. The mounting plate 120 and the heat exchanger 130 can be fixed in the same manner as that in the above described step S102, which will not be repeated in this embodiment of the present application.

The mounting plate 120 and the heat exchanger 130 are fixed by threaded connection, thereby achieving automated assembly and improving the assembly efficiency.

S205: the mounting plate 120 and the box body 112 are fixed by threaded connection.

In step S205, the specific fixing method for the mounting plate 120 and the box body 112 can refer to S104, in this way, the mounting plate 120, the heat exchanger 130, and the box body 112 are fixed to complete the assembly of the mounting plate 120 and heat exchanger 130. The mounting plate 120 and the box body 112 are fixed by threaded-fitting connection, thereby achieving automated assembly and improving assembly efficiency.

S206: the box cover 111 covers the box body 112 and the box cover 111 is connected to the box body 112.

In step S206, the box cover 111 covers the box body 112 and the box cover 111 is connected to the box body 112, this may refer to step S105 above.

It should be noted that in some embodiments, when the above step S204 and step S205 are performed, step S205 may also be performed firstly, followed by step S204, alternatively, in one implementation, steps S204 and S205 can also be performed simultaneously, resulting in higher assembly efficiency.

It can be understood that, in embodiments of the present application, a method of performing assembly in a horizontal direction from the side opening 115*b* to the box body 112 can be used. For example, the heat exchanger 130 can be assembled from the side opening 115*b* into the box body 112 in the horizontal direction firstly, then the mounting plate 120 can also be assembled from the side opening 115*b* into the box body 112 in the horizontal direction, and finally the packaging plate 113 can be assembled to the side opening 115*b*, and the box cover 111 can be assembled onto the box body 112.

In the application, unless otherwise specified or limited, a first feature is "on" or "under" a second feature may mean that the first feature is in direct contact with the second feature, or that the first feature and the second feature are in indirect contact through an intermediate media. Furthermore, the first feature is "over", "above", or "on top of" the second feature may mean that the first feature is right above the second feature or the first feature is not right above the second feature, or simply indicate that the first feature is horizontally higher than the second feature. The first feature is "below", "under", or "on bottom of" the second feature may mean that the first feature is right below the second feature or the first feature is not right below the second feature, or simply indicate the first feature is horizontally lower than the second feature.

In the description of this specification, the reference terms "one embodiment", "some embodiments", "example", "specific example", or "some examples" refer to that the specific features, structures, materials, or features described in conjunction with the embodiment or example is included in at least one embodiment or example of this application. In this specification, the schematic expressions of the above terms do not necessarily refer to the same embodiments or examples. Moreover, the specific features, structures, materials, or features described can be combined in an appropriate manner in any one or more embodiments or examples. In addition, those skilled in the art may combine and assemble different embodiments or examples described in this specification, as well as features of different embodiments or examples, without mutual contradiction.

Although embodiments of the present application have been shown and described above, it can be understood that the above embodiments are exemplary and cannot be understood as limiting the present application. Ordinary technical personnel in the art may make changes, modifications, substitutions, and variations to the above embodiments within the scope of the present application.

What is claimed is:

1. An electric control box, comprising:
a shell; a mounting plate; and
a heat exchanger;
wherein the mounting plate and the heat exchanger are connected by screw-thread fitting of a first fastener and corresponding connecting holes, the mounting plate and the heat exchanger are located inside the shell, and the heat exchanger is located between the mounting plate and an inner bottom face of the shell; and
the mounting plate and the shell are connected by screw-thread fitting of a second fastener and corresponding connecting holes.

2. The electric control box according to claim 1, wherein the heat exchanger comprises a heat exchange pipe, each end of the heat exchange pipe is provided with a connecting member, and the connecting member is provided with a first connecting hole;
the mounting plate comprises a main body, each end of the main body is provided with at least one second connecting hole opposite to the first connecting hole, each of both ends of the mounting plate and each of both ends of the heat exchanger are in threaded connection by screw-thread fitting of the first fastener and the first connecting hole as well as the second connecting hole.

3. The electric control box according to claim 2, wherein the heat exchanger further comprises a heat dissipation plate, the heat dissipation plate is provided on the heat exchange pipe, and the heat dissipation plate is provided with a first assembly hole;

a second assembly hole is provided in the mounting plate at a position corresponding to the first assembly hole, and a middle part of the mounting plate and a middle part of the heat exchanger are in threaded connection by screw-thread fitting of a threaded assembly component and the first assembly hole as well as the second assembly hole.

4. The electric control box according to claim 3, wherein the mounting plate and the heat exchanger are provided in a stacked manner, the mounting plate is provided with an avoidance hole and an avoidance protrusion, and the avoidance protrusion protrudes from a plate face of the mounting plate towards a side facing away from the heat exchanger.

5. The electric control box according to claim 4, wherein the heat dissipation plate comprises a protruding platform, and the avoidance hole is correspondingly arranged with the protruding platform, and the protruding platform passes through the avoidance hole, the avoidance hole is provided in a middle area of the mounting plate.

6. The electric control box according to claim 5, wherein at least two protruding platforms are included, and the at least two protruding platforms are provided in parallel on the heat dissipation plate; at least two avoidance holes are included, and the at least two avoidance holes are provided in parallel in the mounting plate, and the at least two protruding platforms and the at least two avoidance holes are arranged in one-to-one correspondence.

7. The electric control box according to claim 5, wherein a first edgefold is provided on at least a part of an edge of the avoidance hole, and the first edgefold extends along an axial direction of the avoidance hole to be supported at a side of the protruding platform.

8. The electric control box according to claim 7, wherein the first edgefold is provided on a circumferential edge of the avoidance hole.

9. The electric control box according to claim 4, wherein the mounting plate is provided with a reinforcing rib, the reinforcing rib comprises at least one of a convex rib and a concave rib, and the reinforcing rib extends on the mounting plate in a straight-line manner, a curved-line manner, or a meander-line manner.

10. The electric control box according to claim 9, wherein the reinforcing rib extends along a circumferential direction of an electronic device disposed on the mounting plate; and/or the reinforcing rib extends along a circumferential direction of the avoidance hole.

11. The electric control box according to claim 4, wherein the shell comprises a box body and a box cover, the box body is provided with a holding chamber having a first opening, the box cover is connected to the box body, and the box cover covers the first opening;

the mounting plate is provided opposite to the box cover, the heat exchanger is provided opposite to a bottom of the box body, and the mounting plate is in threaded connection with the bottom of the box body.

12. The electric control box according to claim 11, wherein the bottom of the box body is provided with a mounting plate fixing member, and a third connecting hole is provided in the mounting plate, the third connecting hole is correspondingly arranged with the mounting plate fixing member, and the mounting plate and the box body are connected to the third connecting hole and the mounting plate fixing member through the second fastener.

13. The electric control box according to claim 12, wherein the mounting plate fixing member comprises a supporting base and a connecting column, the supporting base is connected to a bottom plate of the box body, the connecting column is connected to a top end of the supporting base, the mounting plate is connected to the connecting column, and a projection of the supporting base onto the bottom plate covers a projection of the connecting column onto the bottom plate.

14. The electric control box according to claim 13, wherein the supporting base comprises a main body part and two mounting parts connected to both opposite sides of the main body part, the two mounting parts are connected to the bottom plate, a gap is provided between the main body part and the bottom plate, and the connecting column is fixed to the main body part.

15. The electric control box according to claim 14, wherein in the two mounting parts and the connecting column included in one supporting base, the two mounting parts are symmetrically provided relative to the connecting column, and bottoms of the two mounting parts are attached to the bottom plate.

16. The electric control box according to claim 13, wherein the heat exchanger further comprises an input pipe and an output pipe; two avoidance protrusions are provided, the avoidance protrusions are provided on both opposite sides of the mounting plate, respectively, and the two avoidance protrusions are provided corresponding to the input pipe and the output pipe respectively.

17. The electric control box according to claim 16, wherein a ventilation grid is provided between the two avoidance protrusions of the mounting plate, a bending part surrounding the ventilation grid is provided around the ventilation grid, the bending part is bent towards a side away from the heat exchanger, and a plane where the ventilation grid is located protrudes towards a side away from the heat exchanger.

18. The electric control box according to claim 17, wherein a second edgefold is provided on an edge of a side of the mounting plate at least close to the ventilation grid, the second edgefold extends towards the heat exchanger, and the second edgefold is provided with an avoidance gap for the input pipe and the output pipe of the heat exchanger to extend out.

19. The electric control box according to claim 16, wherein the box body is provided with an avoidance groove located at a position opposite to each of the input pipe and the output pipe and dented towards an outer side of the holding chamber, and the avoidance groove is provided at an edge of each of two opposite sides of the bottom plate.

20. The electric control box according to claim 16, wherein the box body comprises a box main body and a packaging plate;

the box main body comprises a bottom plate and a side plate, and the side plate is provided around a part of an outer peripheral edge of the bottom plate, so that a side face of the box main body has a first side opening;

the packaging plate is provided at the first side opening, and the packaging plate and the side plate are located on a same side of the bottom plate.

* * * * *